(12) United States Patent
Lee et al.

(10) Patent No.: US 10,304,943 B2
(45) Date of Patent: May 28, 2019

(54) INTEGRATED CIRCUIT DEVICES WITH BLOCKING LAYERS

(71) Applicant: Samsung Electronics Co., Ltd., Suwon-si, Gyeonggi-do (KR)

(72) Inventors: Sang Hyun Lee, Seoul (KR); Jun-sik Kim, Hwaseong-si (KR); Kyo-suk Chae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/899,683

(22) Filed: Feb. 20, 2018

(65) Prior Publication Data

US 2019/0027582 A1 Jan. 24, 2019

(30) Foreign Application Priority Data

Jul. 21, 2017 (KR) ........................ 10-2017-0092740

(51) Int. Cl.
| | |
|---|---|
| *H01L 29/78* | (2006.01) |
| *H01L 29/66* | (2006.01) |
| *H01L 29/423* | (2006.01) |
| *H01L 29/49* | (2006.01) |
| *H01L 21/762* | (2006.01) |
| *H01L 21/28* | (2006.01) |
| *H01L 29/51* | (2006.01) |

(52) U.S. Cl.
CPC .. *H01L 29/66621* (2013.01); *H01L 21/28008* (2013.01); *H01L 21/762* (2013.01); *H01L 29/4236* (2013.01); *H01L 29/4966* (2013.01); *H01L 29/4983* (2013.01); *H01L 29/518* (2013.01); *H01L 29/785* (2013.01)

(58) Field of Classification Search
CPC ............ H01L 29/66621; H01L 29/518; H01L 21/28008; H01L 29/4983; H01L 21/762; H01L 29/4966; H01L 29/4236; H01L 29/785

See application file for complete search history.

(56) References Cited

U.S. PATENT DOCUMENTS

| | | |
|---|---|---|
| 9,178,039 B2 | 11/2015 | Park et al. |
| 9,356,029 B2 | 5/2016 | Oh et al. |
| 9,502,526 B2 | 11/2016 | Jang |
| 9,601,590 B2 | 3/2017 | Kang |
| 2014/0197484 A1 | 7/2014 | Anathan et al. |
| 2015/0214313 A1 | 7/2015 | Oh et al. |
| 2015/0214362 A1 | 7/2015 | Oh |
| 2016/0172488 A1 | 6/2016 | Oh et al. |
| 2016/0315088 A1 | 10/2016 | Kang et al. |
| 2017/0047421 A1 | 2/2017 | Oh et al. |
| 2017/0069735 A1 | 3/2017 | Oh et al. |
| 2017/0125422 A1* | 5/2017 | Kang ................ H01L 27/10823 |
| 2017/0186844 A1* | 6/2017 | Kim .................. H01L 27/10823 |

* cited by examiner

*Primary Examiner* — David Vu
(74) *Attorney, Agent, or Firm* — Myers Bigel, P.A.

(57) ABSTRACT

An integrated circuit device may include a gate dielectric layer on an inner surface of a gate trench of a substrate, a gate structure filling a portion of the gate trench on the gate dielectric layer, and an insulating, capping pattern on an upper surface of the gate structure in the gate trench. The gate structure may include a lower gate line having a first work function, an upper gate line having a second work function lower than the first work function, a first blocking layer between the lower gate line and the upper gate line, and a second blocking layer between the upper gate line and the insulating capping pattern.

18 Claims, 43 Drawing Sheets

INTEGRATED CIRCUIT DEVICES WITH BLOCKING LAYERS

CROSS-REFERENCE TO RELATED APPLICATION

This application claims priority under 35 U.S.C. § 119 to Korean Patent Application No. 10-2017-0092740, filed on Jul. 21, 2017 in the Korean Intellectual Property Office, the entire contents of which are incorporated herein in their entirety by reference.

BACKGROUND

Embodiments of the inventive concepts relate to integrated circuit devices, and more particularly, to integrated circuit devices with buried word lines.

As the degree of integration of an integrated circuit device constituting a buried channel array transistor (BCAT), in which a plurality of word lines are buried in a substrate, is increased, the pitch of the plurality of word lines is gradually reduced and a gate induced drain leakage (GIDL) current is increased, which may adversely affect refresh characteristics of the integrated circuit device. Accordingly, in order to suppress the GIDL current and precisely control a threshold voltage of a gate electrode, techniques for employing different kinds of materials having different work functions as components of the gate electrode have been developed. In some integrated circuit devices comprising gate electrodes including materials having different work functions, the different materials may interact with each other via diffusion. Accordingly, it may be difficult to control the work functions. Moreover, defects may be caused because of work function changes or volume expansion may occur.

SUMMARY

Some embodiments of the inventive concepts may provide integrated circuit devices including a buried channel array transistor (BCAT). An integrated circuit device may have a new structure capable of suppressing deterioration of electrical characteristics and suppressing a gate induced drain leakage (GIDL) current by keeping a work function of each of different kinds of materials constituting a gate electrode constant and thereby improving electrical characteristics.

According to some embodiments of the inventive concepts, integrated circuit devices are provided. An integrated circuit device may include a substrate including a gate trench, a gate dielectric layer on an inner surface of the gate trench, a gate structure filling a portion of the gate trench on the gate dielectric layer, and an insulating capping pattern on an upper surface of the gate structure in the gate trench. The gate structure may include a lower gate line having a first work function, an upper gate line having a second work function lower than the first work function, a first blocking layer between the lower gate line and the upper gate line, and a second blocking layer between the upper gate line and the insulating capping pattern.

According to some embodiments of the inventive concepts, integrated circuit devices are provided. An integrated circuit device may include a substrate including an active region defined by an isolation layer. The substrate may further include a line-shaped gate trench on the active region. The integrated circuit device may further include a gate dielectric layer on the active region and on the isolation layer in the gate trench, a gate structure filling a portion of the gate trench on the gate dielectric layer, an insulating capping pattern on an upper surface of the gate structure in the gate trench, and a pair of source/drain regions on opposing sides of the gate structure in the active region. The gate structure may include a lower gate line having a first work function, an upper gate line having a second work function lower than the first work function, a first blocking layer between the lower gate line and the upper gate line, and a second blocking layer between the upper gate line and the insulating capping pattern.

According to some embodiments of the inventive concepts, integrated circuit devices are provided. An integrated circuit device may include a substrate. The substrate may include a plurality of active regions spaced apart from each other and a line-shaped gate trench extending across the plurality of active regions. The integrated circuit device may further include a gate dielectric layer extending across the plurality of active regions in the gate trench, a gate structure filling a portion of the gate trench on the gate dielectric layer and having gate sidewall portions facing the plurality of active regions, and an insulating capping pattern on an upper surface of the gate structure in the gate trench and having insulating sidewall portions facing the plurality of active regions. The gate structure may include a lower gate line having a first work function, an upper gate line having a second work function lower than the first work function, a first blocking layer between the lower gate line and the upper gate line, and a second blocking layer between the upper gate line and the insulating capping pattern.

BRIEF DESCRIPTION OF THE DRAWINGS

Embodiments of the inventive concepts will be more clearly understood in view of the detailed description and the accompanying drawings.

DETAILED DESCRIPTION OF THE EMBODIMENTS

Figure 1A:
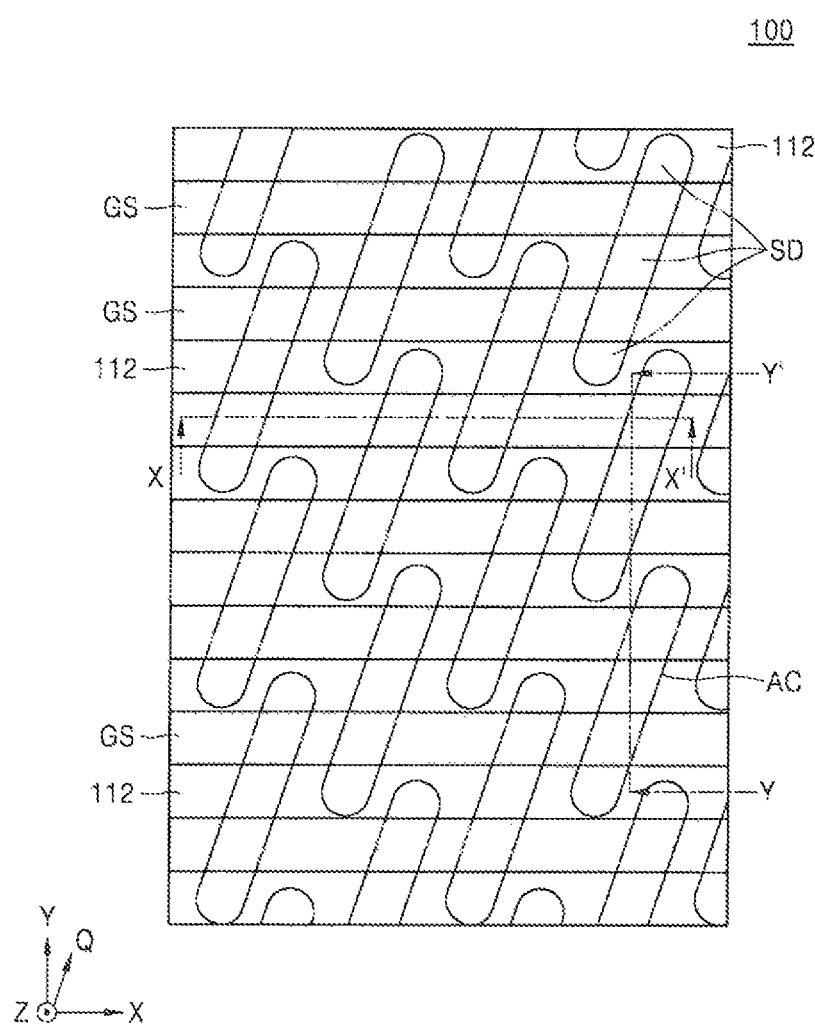
FIG. 1A is a plan view illustrating an integrated circuit device according to some embodiments of the inventive concepts.

Some embodiments of the inventive concepts will be described in detail with reference to the accompanying drawings. Like reference numerals in the drawings may denote like elements, and thus their description may be omitted for brevity. The sizes and relative sizes of layers and regions may be exaggerated for clarity.

Figure 1B:
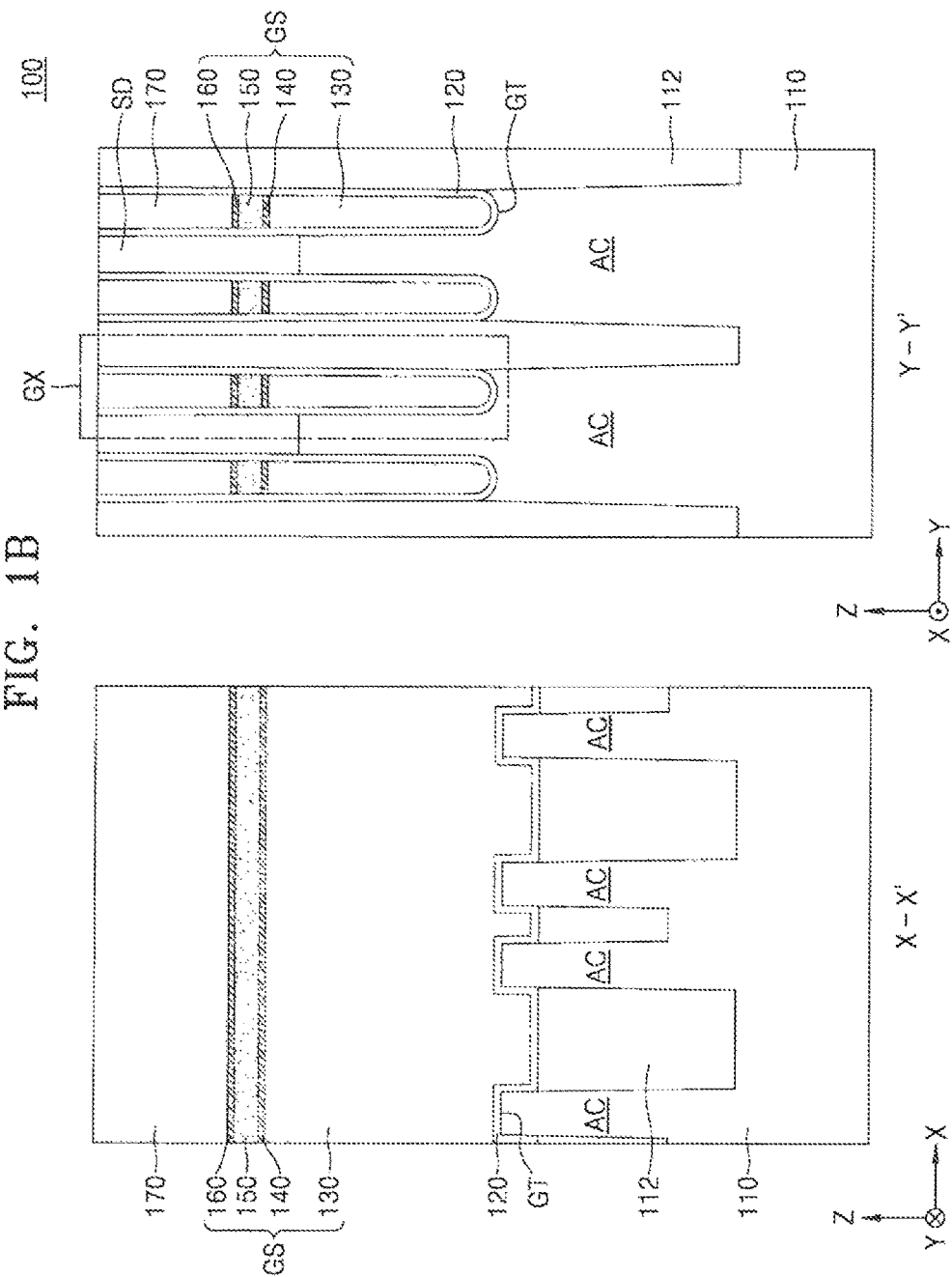
FIG. 1B is a cross-sectional view taken along a line X-X' and a line Y-Y' of FIG. 1A.

FIG. 1A is a plan view illustrating an integrated circuit device according to some embodiments of the inventive concepts. FIG. 1B is a cross-sectional view taken along a line X-X' and a line Y-Y' of FIG. 1A.

Referring to FIGS. 1A and 1B, an integrated circuit device 100 may include a substrate 110 on which a plurality of active regions AC defined by an isolation layer 112 and a plurality of gate trenches GT extending across the plurality of active regions AC are disposed.

The plurality of active regions AC may be formed spaced apart from each other in an X direction and a Y direction, and each of the active regions AC may extend in an oblique direction so as to have a long axis in a direction different from the X direction and the Y direction (a Q direction in FIG. 1A). The plurality of gate trenches GT may have a plurality of line shapes extending parallel to each other in the X direction.

The isolation layer 112 may include a silicon oxide layer, a silicon nitride layer, or a combination thereof.

A gate dielectric layer 120, a gate structure GS filling a portion of a gate trench GT on a gate dielectric layer 120, and an insulating capping pattern 170 for covering the gate structure GS may be in the gate trench GT. The insulating capping pattern 170 may be on an upper surface of the gate structure GS.

A level of a portion of the substrate 110 at a lower surface of the gate trench GT may be higher than a level of a portion of the substrate 110 at a lower surface of the isolation layer 112. The lower surface of the gate structure GS may have an uneven shape corresponding to a bottom profile of the plurality of gate trenches GT. Therefore, a saddle fin field effect transistor (FinFET) having a saddle fin structure may be in the plurality of active regions AC.

The gate dielectric layer 120 may cover an inner surface of the gate trench GT to contact an active region AC and the isolation layer 112. The gate dielectric layer 120 may include a silicon oxide layer, a silicon nitride layer, a silicon oxynitride layer, an oxide/nitride/oxide (ONO) layer, or a high-k dielectric layer having a dielectric constant higher than that of a silicon oxide layer. For example, the high-k dielectric layer may have a dielectric constant of about 10 to 25, and may include, for example, hafnium oxide ($HfO_2$), aluminum oxide ($Al_2O_3$), hafnium aluminum oxide ($HfAlO_3$), tantalum oxide ($Ta_2O_5$), and/or titanium oxide ($TiO_2$).

The insulating capping pattern 170 may include a silicon nitride layer, a silicon oxynitride layer, a silicon oxide layer, or a combination thereof.

The gate structure GS may have gate sidewalls facing the active region AC and the insulating capping pattern 170 may include insulating sidewall portions facing the active region AC. Source/drain regions SD may be on both sides of the gate structure GS in the plurality of active regions AC.

The gate structure GS may include a lower gate line 130 having a first work function and an upper gate line 150 having a second work function lower than the first work function. The lower gate line 130 may include metal, metal nitride, metal carbide, or a combination thereof. In some embodiments, the lower gate line 130 may include titanium (Ti), titanium nitride (TiN), tantalum (Ta), tantalum nitride (TaN), tungsten (W), tungsten nitride (WN), titanium silicide nitride (TiSiN), tungsten silicide nitride (WSiN), or a combination thereof. The upper gate line 150 may include doped polysilicon.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

The first blocking layer 140 may be interposed between the lower gate line 130 and the upper gate line 150. The first blocking layer 140 may prevent components of the lower gate line 130 and the upper gate line 150 from mutually diffusing or reacting between the lower gate line 130 and the upper gate line 150. In some embodiments, the first blocking layer 140 may prevent the metal included in the lower gate line 130 from reacting with silicon included in the upper gate line 150 and may prevent a metal silicide layer from being formed between the lower gate line 130 and the upper gate line 150.

A second blocking layer 160 may be interposed between the upper gate line 150 and the insulating capping pattern 170. The second blocking layer 160 may prevent components of the upper gate line 150 and the insulating capping pattern 170 from mutually diffusing or reacting between the upper gate line 150 and the insulating capping pattern 170.

Each of the first blocking layer 140 and the second blocking layer 160 may have sidewalls facing the source/drain regions SD with the gate dielectric layer 120 therebetween.

The first blocking layer 140 and the second blocking layer 160 may be formed of different materials. Each of the first blocking layer 140 and the second blocking layer 160 may include a conductive material, a dielectric material, or a combination thereof. In some embodiments, the first blocking layer 140 may include metal and the second blocking layer 160 may be substantially free of metal. In some embodiments, at least one of the first blocking layer 140 and the second blocking layer 160 may include an oxide layer or a nitride layer including a metal, or a combination thereof. In some embodiments, at least one of the first blocking layer 140 and the second blocking layer 160 may include an oxide layer or a nitride layer substantially free of metal, or a combination thereof. In some embodiments, the first blocking layer 140 may include a multilayer including metal and the second blocking layer 160 may include a monolayer substantially free of metal. Each of the first blocking layer 140 and the second blocking layer 160 may have a thickness of about 1 to about 20 Å.

In the gate structure GS of the integrated circuit device 100, the first blocking layer 140 may be interposed between the lower gate line 130 and the upper gate line 150 having different work functions, so that problems that the components of the lower gate line 130 and the upper gate line 150 are mutually diffused or reacted to form undesired substances such as silicide, to change work functions, or to change volumes may be prevented, which may contribute to maintaining original properties and electrical characteristics of each of the lower gate line 130 and the upper gate line 150.

Furthermore, in the gate structure GS of the integrated circuit device 100, it may be possible to prevent problems such as an undesired reaction between components of the insulating capping pattern 170 and the upper gate line 150 due to downward diffusion of components of the insulating capping pattern 170 on the upper gate line 150 or a change in work function of the upper gate line 150 even when the second blocking layer 160 is interposed between the upper gate line 150 and the insulating capping pattern 170, and a thickness of the upper gate line 150 becomes too thin or a relatively large thickness deviation occurs in the upper gate line 150 as a result of an etch-back process during a process of forming the upper gate line 150. In addition, it may be possible to prevent the upper gate line 150 or the lower gate line 130 located therebelow from being physically or chemically damaged because the upper gate line 150 may be protected by the second blocking layer 160 during a process of forming the insulating capping pattern 170.

FIGS. 2 to 8 are cross-sectional views illustrating an integrated circuit device according to some embodiments of the inventive concepts. Main components of portions corresponding to "GX" in FIG. 1B are enlarged and illustrated in FIGS. 2 to 8. In FIGS. 2 to 8, the same reference numerals as in FIGS. 1A and 1B may denote the same elements, and descriptions thereof may be omitted for brevity.

Figure 2:
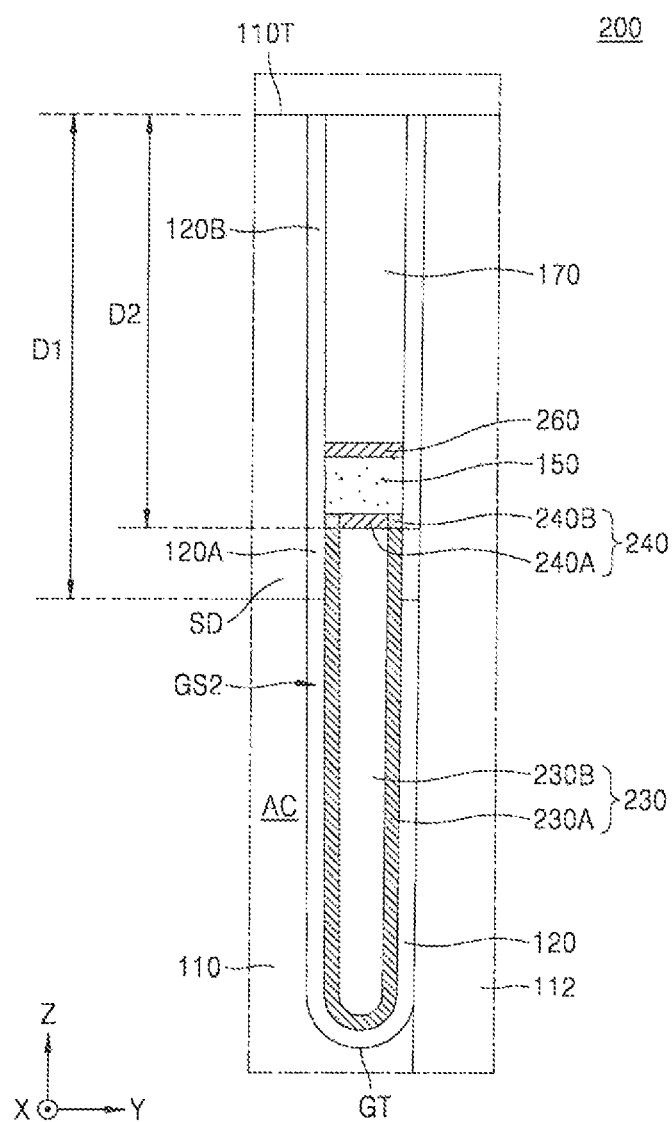
FIGS. 2 to 8 are cross-sectional views illustrating an integrated circuit device according to some embodiments of the inventive concepts.

Referring to FIG. 2, an integrated circuit device 200 has substantially the same or similar configuration as the integrated circuit device 100 illustrated in FIGS. 1A and 1B except for differences as noted. A gate structure GS2 of the integrated circuit device 200 may be formed by sequentially stacking a lower gate line 230, a first blocking layer 240, the upper gate line 150, and a second blocking layer 260.

The lower gate line 230 may have substantially the same or similar configuration as the lower gate line 130 described with reference to FIGS. 1A and 1B. However, the lower gate line 230 may include a plurality of metal-containing layers including a metal-containing liner 230A and a metal layer 230B which are sequentially stacked on the gate dielectric layer 120. The metal-containing liner 230A may be in contact with the gate dielectric layer 120. The metal layer 230B may be spaced apart from the gate dielectric layer 120 and may be surrounded by the metal-containing liner 230A and the first blocking layer 240. In some embodiments, the metal-containing liner 230A may include TiN, and the metal layer 230B may include W, but the inventive concepts are not limited thereto.

The first blocking layer 240 may have substantially the same or similar configuration as the first blocking layer 140 described with reference to FIGS. 1A and 1B. However, the first blocking layer 240 may include metal nitride, metal oxide, metal oxynitride, or a combination thereof. The first blocking layer 240 may include an inner metal-containing layer 240A spaced apart from the gate dielectric layer 120 and an outer metal-containing layer 240B interposed between the gate dielectric layer 120 and the inner metal-containing layer 240A. The inner metal-containing layer 240A may be in contact with an upper surface of the metal layer 230B and the outer metal-containing layer 240B may be in contact with an upper surface of the metal-containing liner 230A.

The inner metal-containing layer 240A and the outer metal-containing layer 240B may have an integrally connected structure. The inner metal-containing layer 240A and the outer metal-containing layer 240B may include different compositions from each other. In some embodiments, the inner metal-containing layer 240A may include nitride or oxide of a first metal constituting the metal layer 230B, and the outer metal-containing layer 240B may include oxynitride or nitride of a second metal constituting the metal-containing liner 230A. For example, when the metal layer 230B includes W and the metal-containing liner 230A includes TiN, the inner metal-containing layer 240A may include a WN layer or a tungsten oxide (WO) layer, and the outer metal-containing layer 240B may include an N-rich TiN layer, or a titanium oxide nitride (TiON) layer. As used herein, the term "N-rich TiN layer" may refer to a TiN layer having an N content greater than an N content of a TiN layer having a stoichiometric atomic ratio of Ti and N.

The second blocking layer 260 may have substantially the same or similar configuration as the second blocking layer 160 described with reference to FIGS. 1A and 1B. However, the second blocking layer 260 may include the same chemical elements as chemical elements constituting the insulating capping pattern 170, but may include a nitrogen content that is greater than a nitrogen content in the insulating capping pattern 170. In some embodiments, the insulating capping pattern 170 may include a silicon nitride layer having a first nitrogen content and the second blocking layer 260 may include a silicon nitride layer having a second nitrogen content greater than the first nitrogen content. For example, the second blocking layer 260 may include an N-rich silicon nitride layer. As used herein, the term "N-rich silicon nitride layer" may refer to a silicon nitride layer having an N content greater than an N content of a silicon nitride layer having a stoichiometric atomic ratio of Si and N.

In the gate structure GS2 of the integrated circuit device 200, the first blocking layer 240 may be interposed between the lower gate line 230 and the upper gate line 150 having different work functions, so that problems that the components of the lower gate line 230 and the upper gate line 150 are mutually diffused or reacted resulting in formation of undesired substances such as silicide, a change in work functions, or a change in volumes, may be prevented, which may contribute to maintaining original properties and electrical characteristics of each of the lower gate line 230 and the upper gate line 150. Furthermore, it may be possible to prevent the upper gate line 150 or layers located therebelow from being physically or chemically damaged by the second blocking layer 260 interposed between the upper gate line 150 and the insulating capping pattern 170.

The gate dielectric layer 120 may include a first charge trapping region 120A configured to trap fixed charges at a first density and a second charge trapping region 120B configured to trap fixed charges at a second density higher than the first density. As used herein, the term "fixed charge" may refer to a fixed charge introduced into the gate dielectric layer 120 through an intentional process. The fixed charge may be a positive charge or a negative charge. When the gate structure GS2 includes an n-channel metal-oxide-semiconductor (NMOS) transistor, fixed charges in the first charge trapping region 120A and the second charge trapping region 120B may be positive. When the gate structure GS2 includes a p-channel metal-oxide-semiconductor (PMOS) transistor, fixed charges in the first charge trapping region 120A and the second charge trapping region 120B may be negative. The second charge trapping region 120B of the gate dielectric layer 120 may be closer to an upper surface 110T of the substrate 110 than the first charge trapping region 120A. In the gate dielectric layer 120, the second charge trapping region 120B may extend from the upper surface 110T of the substrate 110 to a second depth D2 and the first charge trapping region 120A may extend from the second depth D2 to a first depth D1 deeper than the second depth D2. As used herein, a depth or level may refer to a distance from the upper surface 110T of the substrate 110 towards a lower surface of the substrate 110 in a direction that is perpendicular to the upper surface 110T of the substrate 110. Accordingly, a depth or level that is referred to as being deeper than another depth or level may be further from the upper surface 110T of the substrate 110 in the direction towards the lower surface of the substrate 110.

The first charge trapping region 120A and the second charge trapping region 120B of the gate dielectric layer 120 may be in contact with the source/drain regions SD. The first charge trapping region 120A of the gate dielectric layer 120 may be interposed between the source/drain regions SD and the lower gate line 230. The lower gate line 230 may have a sidewall facing the first charge trapping region 120A of the gate dielectric layer 120. The second charge trapping region 120B of the gate dielectric layer 120 may extend between the source/drain regions SD and the upper gate line 150, between the source/drain regions SD and the second blocking layer 260, and between the source/drain regions SD and the insulating capping pattern 170. Each of the upper gate line 150, the second blocking layer 260, and the insulating capping pattern 170 may have a sidewall facing the second charge trapping region 120B of the gate dielectric layer 120.

By including the first charge trapping region 120A and the second charge trapping region 120B, in which fixed charges are trapped, in the gate dielectric layer 120, a gate induced drain leakage (GIDL) current of a buried channel array transistor (BCAT) including the gate structure GS2 may be suppressed and a leakage current in a gate-off state may be suppressed.

Figure 3:
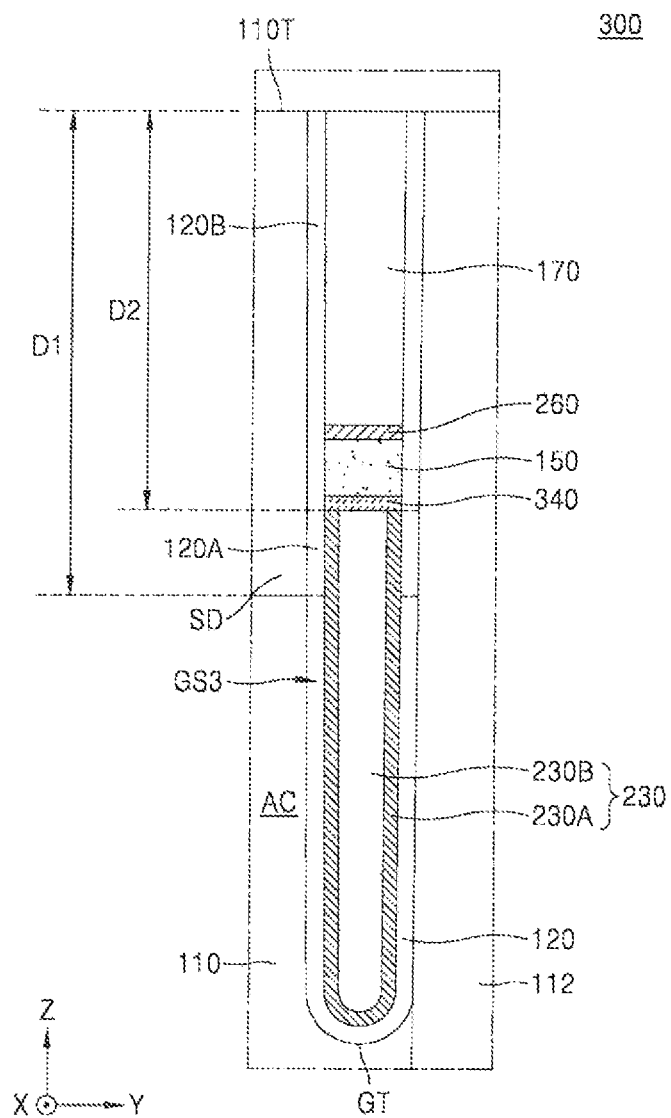

Referring to FIG. 3, an integrated circuit device 300 may have substantially the same or similar configuration as the integrated circuit device 200 illustrated in FIG. 2 except for differences as noted. A gate structure GS3 of the integrated circuit device 300 may be formed by sequentially stacking the lower gate line 230, a first blocking layer 340, the upper gate line 150, and the second blocking layer 260.

The first blocking layer 340 may be a monolayer. For example, the first blocking layer 340 may include a TiN layer. The first blocking layer 340 may have sidewalls contacting the gate dielectric layer 120. A lower surface of the first blocking layer 340 may include a portion in contact with the metal-containing liner 230A and a portion in contact with the metal layer 230B. The first blocking layer 340 may have a greater nitrogen content as the first blocking layer 340 approaches an upper surface of the first blocking layer 340 contacting the upper gate line 150 from the lower surface contacting the lower gate line 230. For example, when the first blocking layer 340 is a TiN layer, a nitrogen content in the TiN layer may become greater from the lower surface of the first blocking layer 340 toward the upper surface of the first blocking layer 340. An N-rich TiN layer may be formed from an upper surface of the first blocking layer 340 to at least a portion of a depth of the first blocking layer 340. A nitrogen content in the N-rich TiN layer may become greater toward the upper surface of the first blocking layer 340.

In the gate structure GS3 of the integrated circuit device 300, the first blocking layer 340 may be interposed between the lower gate line 230 and the upper gate line 150 having different work functions, and the second blocking layer 260 may be interposed between the upper gate line 150 and the insulating capping pattern 170. Therefore, problems that components of each of the lower gate line 230 and the upper gate line 150 are mutually diffused or reacted to form undesired substances such as metal silicide, to change work functions, or to change volumes may be prevented, which may contribute to maintaining original properties and electrical characteristics of each of the lower gate line 230 and the upper gate line 150. Further, by having a structure in which fixed charges are trapped in the gate dielectric layer 120, a gate induced drain leakage (GIDL) current of a buried channel array transistor (BCAT) including the gate structure GS3 may be suppressed and a leakage current in a gate-off state may be suppressed.

Figure 4:
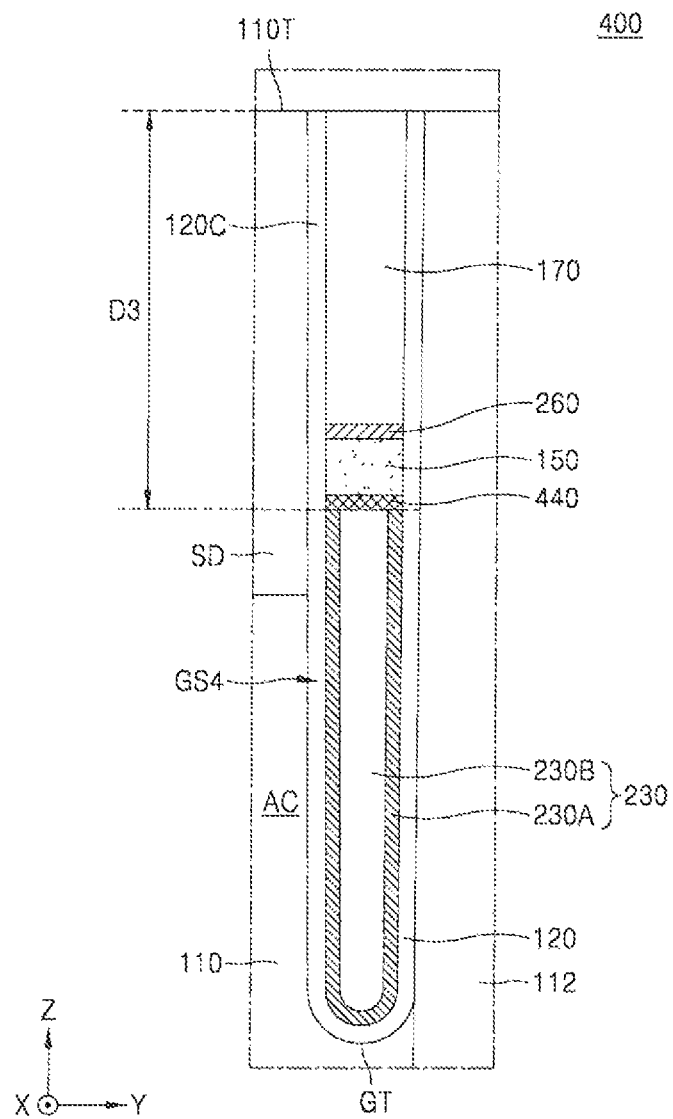

Referring to FIG. 4, the integrated circuit device 400 may have substantially the same or similar configuration as the integrated circuit device 300 illustrated in FIG. 3 except for differences as noted. A gate structure GS4 of the integrated circuit device 400 may be formed by sequentially stacking the lower gate line 230, a first blocking layer 440, the upper gate line 150, and the second blocking layer 260.

The first blocking layer 440 may be a monolayer. The first blocking layer 440 may have sidewalls contacting the gate dielectric layer 120. A lower surface of the first blocking layer 440 may include a portion in contact with the metal-containing liner 230A and a portion in contact with the metal layer 230B. For example, the first blocking layer 440 may include a TiN layer. A nitrogen content in the first blocking layer 440 may be substantially constant along a thickness direction (a Z direction) of the first blocking layer 440.

The gate dielectric layer 120 may include a charge trapping region 120C containing fixed charges. When the gate structure GS4 constitutes an NMOS transistor, the fixed charges in the charge trapping region 120C may be positive. When the gate structure GS4 constitutes a PMOS transistor, the fixed charges in the charge trapping region 120C may be negative. The charge trapping region 120C of the gate dielectric layer 120 may extend from the upper surface 110T of the substrate 110 to a third depth D3. The third depth D3 may be approximately the same or deeper than a level of a lower surface of the upper gate line 150. The charge trapping region 120C of the gate dielectric layer 120 may extend between the source/drain regions SD and the insulating capping pattern 170, between the source/drain regions SD and the second blocking layer 260, and between the source/drain regions SD and the upper gate line 150.

In the gate structure GS4 of the integrated circuit device 400, the first blocking layer 440 may be interposed between the lower gate line 230 and the upper gate line 150 having different work functions, and the second blocking layer 260 may be interposed between the upper gate line 150 and the insulating capping pattern 170. Therefore, problems that components of each of the lower gate line 230 and the upper gate line 150 are mutually diffused or reacted to form undesired substances such as metal silicide, to change work functions, or to change volumes may be prevented, which may contribute to maintaining original properties and electrical characteristics of each of the lower gate line 230 and the upper gate line 150. Further, by including a structure in which fixed charges are trapped in the gate dielectric layer 120, a gate induced drain leakage (GIDL) current of a buried channel array transistor (BCAT) including the gate structure GS4 may be suppressed and a leakage current in a gate-off state may be suppressed.

Figure 5:
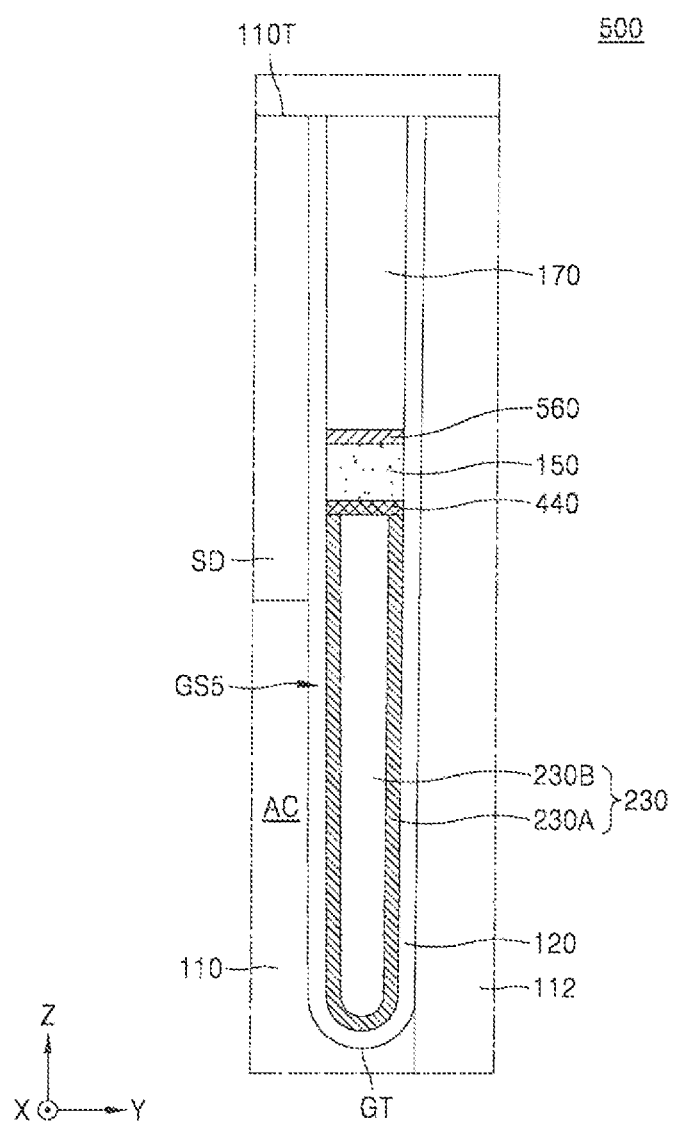

Referring to FIG. 5, the integrated circuit device 500 may have substantially the same or similar configuration as the integrated circuit device 400 illustrated in FIG. 4 except for differences as noted. For example, in an integrated circuit device 500, the gate dielectric layer 120 does not include the charge trapping region 120C in which fixed charges are trapped. A gate structure GS5 of the integrated circuit device 500 may be formed by sequentially stacking the lower gate line 230, the first blocking layer 440, the upper gate line 150, and a second blocking layer 560. The second blocking layer 560 may include an insulating layer substantially free of metal. For example, the second blocking layer 560 may include a nitride layer, an oxide layer, or a combination thereof.

In some embodiments, the second blocking layer 560 and the insulating capping pattern 170 may be formed of different materials. In some embodiments, the second blocking layer 560 and the insulating capping pattern 170 may be formed of the same material as one another. In some embodiments, the second blocking layer 560 may be omitted.

Figure 6:
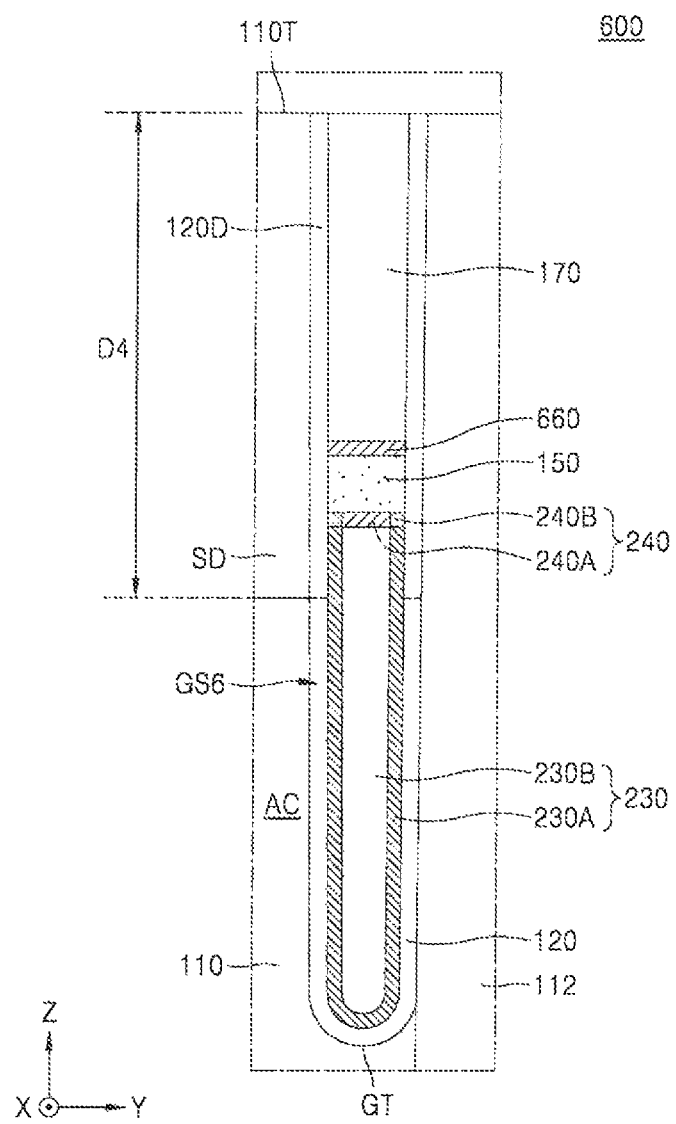

Referring to FIG. 6, an integrated circuit device 600 may have substantially the same or similar configuration as the integrated circuit device 200 illustrated in FIG. 2 except for differences as noted. For example, in an integrated circuit device 600, the gate dielectric layer 120 may include a charge trapping region 120D containing fixed charges. The charge trapping region 120D may extend from the upper surface 110T of the substrate 110 to a fourth depth D4. The fourth depth D4 may be deeper than a level of an upper surface of the lower gate line 230. A gate structure GS6 of the integrated circuit device 600 may be formed by sequentially stacking the lower gate line 230, the first blocking layer 240, the upper gate line 150, and a second blocking layer 660. The second blocking layer 660 may have substantially the same or similar configuration as the second blocking layer 560 described with reference to FIG. 5. In some embodiments, the second blocking layer 660 may be omitted.

Figure 7:
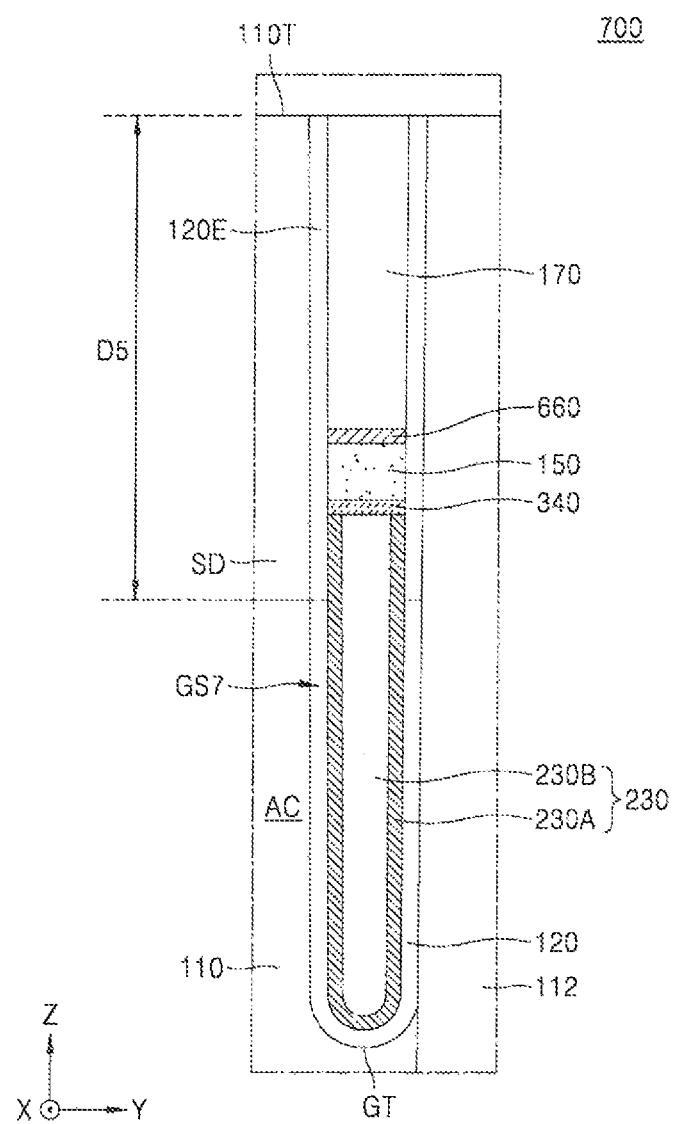

Referring to FIG. 7, an integrated circuit device 700 may have substantially the same or similar configuration as the integrated circuit device 300 illustrated in FIG. 3 except for differences as noted. For example, in the integrated circuit device 700, the gate dielectric layer 120 may include a charge trapping region 120E containing fixed charges. The charge trapping region 120E may extend from the upper surface 110T of the substrate 110 to a fifth depth D5. The fifth depth D5 may be deeper than a level of the upper surface of the lower gate line 230. A gate structure GS7 of the integrated circuit device 700 may be formed by sequentially stacking the lower gate line 230, the first blocking layer 340, the upper gate line 150, and the second blocking layer 660. A specific structure of the first blocking layer 340 may be as described with reference to FIG. 3. A specific structure of the second blocking layer 660 may be as described with reference to FIG. 6. In some embodiments, the second blocking layer 660 may be omitted.

Figure 8:
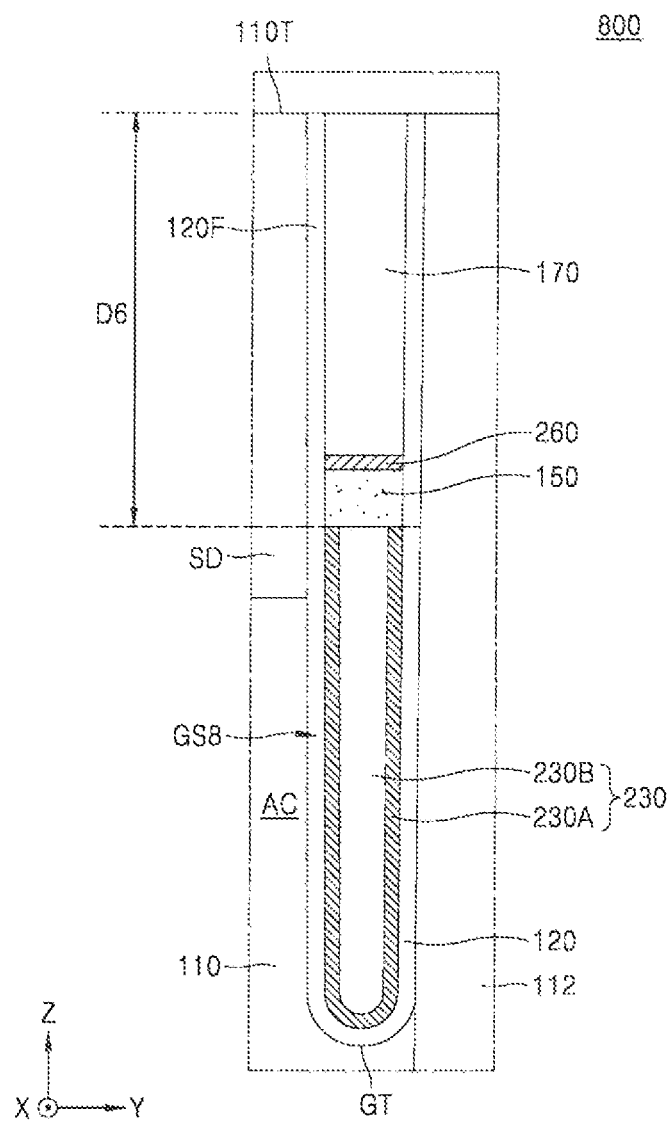

Referring to FIG. 8, an integrated circuit device 800 may have substantially the same or similar configuration as the integrated circuit device 200 illustrated in FIG. 2 except for differences as noted. For example, a gate structure GS8 of the integrated circuit device 800 may not include the first blocking layer 240. The gate structure GS8 of the integrated circuit device 800 may be formed by sequentially stacking the lower gate line 230, the upper gate line 150, and the second blocking layer 260. The lower gate line 230 and the upper gate line 150 may directly contact each other.

The gate dielectric layer 120 may include a charge trapping region 120F containing fixed charges. The charge trapping region 120F may extend from the upper surface 110T of the substrate 110 to a sixth depth D6. The sixth depth D6 may be approximately the same or deeper than a level of the lower surface of the upper gate line 150.

Hereinafter, methods of manufacturing integrated circuit devices according to some embodiments of the inventive concepts will be described in detail.

FIGS. 9A to 9G are cross-sectional views illustrating operations of methods of manufacturing integrated circuit devices, according to some embodiments of the inventive concepts, in a process sequence. Methods of manufacturing the integrated circuit device 200 of FIG. 2 will be described with reference to FIGS. 9A to 9G. FIGS. 9A to 9G illustrate main components of portions corresponding to the cross-section taken along the line Y-Y' of FIG. 1A, in a process sequence.

Figure 9A:
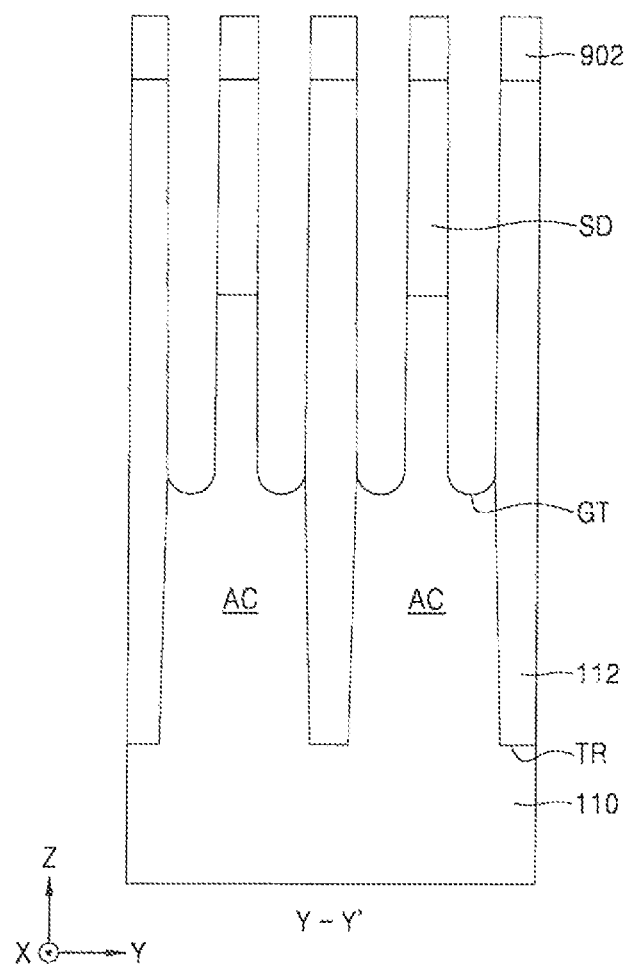
FIGS. 9A to 9G are cross-sectional views illustrating operations of methods of manufacturing integrated circuit devices, according to some embodiments of the inventive concepts, in a process sequence.

Referring to FIG. 9A, an isolation trench TR may be formed in the substrate 110 to define a plurality of active regions AC. The isolation trench TR may be formed such that a relatively wide portion may have a relatively large depth and a relatively narrow portion may have a relatively small depth, similarly to that illustrated in FIG. 1B. The isolation layer 112 filling the isolation trench TR may be formed around the plurality of active regions AC and the plurality of source/drain regions SD may be formed in the plurality of active regions AC. At least one of an atomic layer deposition (ALD) process, a chemical vapor deposition (CVD) process, a radical oxidation process, and a natural oxidation process may be used to form the isolation layer 112.

A plurality of mask line patterns 902 may be formed on the plurality of active regions AC and the isolation layer 112. As used herein, when a layer or region is referred to as being "on" another layer or region, the layer or region may be formed directly on the other layer or region, or there may be an intervening layer or region therebetween. The plurality of mask line patterns 902 may be spaced apart from each other and extend in parallel with each other in the X direction. The plurality of mask line patterns 902 may include a hard mask pattern of a monolayer or multilayer structure. For example, the plurality of mask line patterns 902 may include, but are not limited to, an oxide layer, a nitride layer, or a combination thereof. The plurality of active regions AC and the isolation layer 112 may be etched using the plurality of mask line patterns 902 as an etch mask to form the plurality of gate trenches GT extending in parallel in the X direction.

Figure 9B:
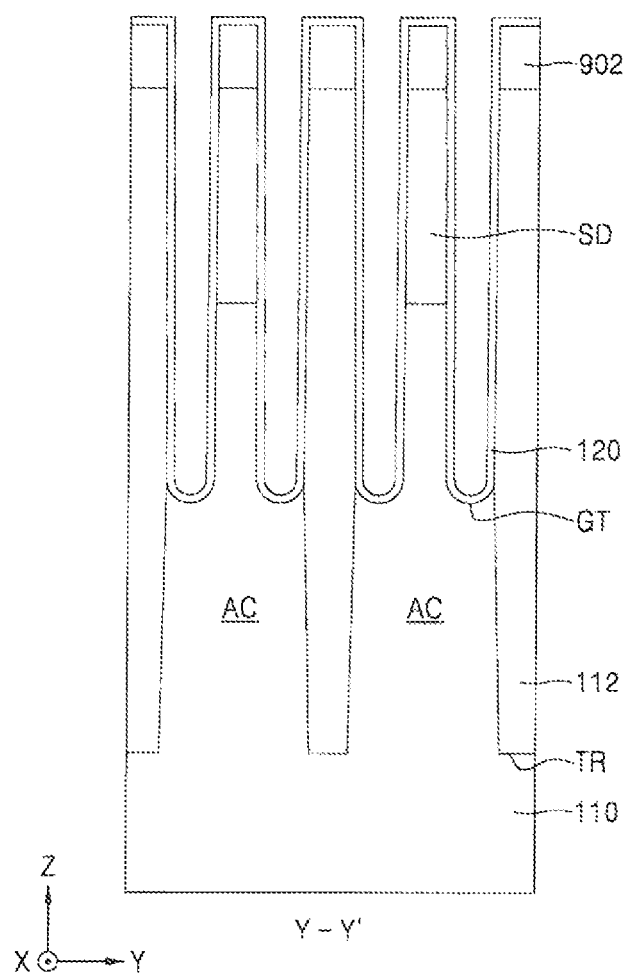

Referring to FIG. 9B, the gate dielectric layer 120 covering inner surfaces of the plurality of gate trenches GT may be formed. A thermal oxidation process, an ALD process, or a combination thereof may be used to form the gate dielectric layer 120.

Figure 9C:
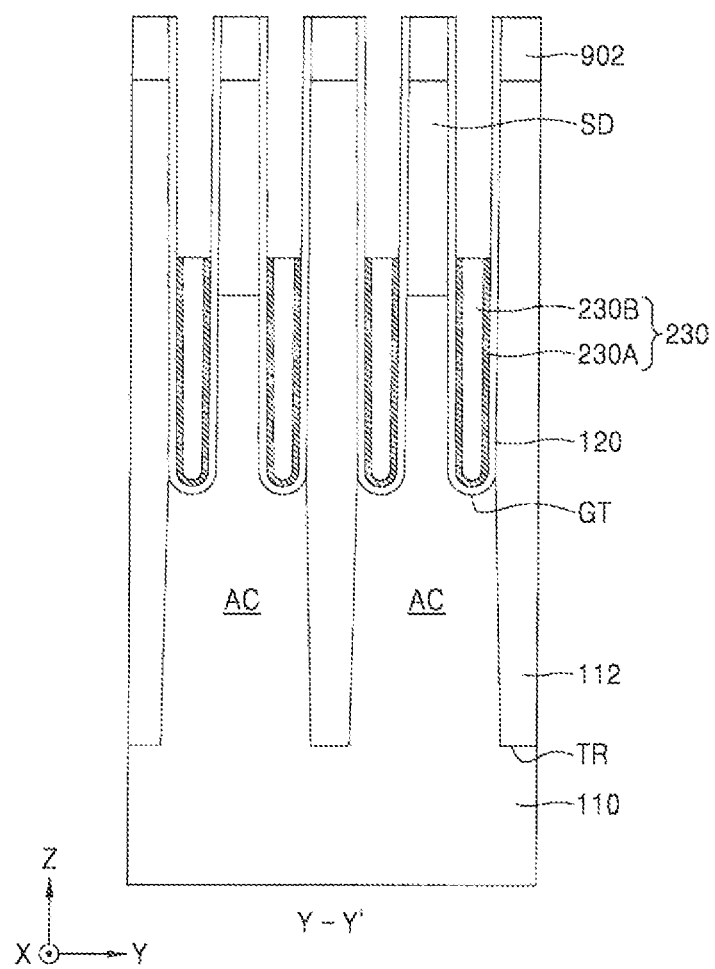

Referring to FIG. 9C, the metal-containing liner 230A and the metal layer 230B filling the plurality of gate trenches GT may be formed on the gate dielectric layer 120 of FIG. 9B. After forming the metal-containing liner 230A and the metal layer 230B, some portions thereof may be removed from the plurality of gate trenches GT by an etch-back process so that a plurality of lower gate lines 230 are formed. After the plurality of lower gate lines 230 are formed, an upper surface of the plurality of mask line patterns 902 may be exposed.

Figure 9D:
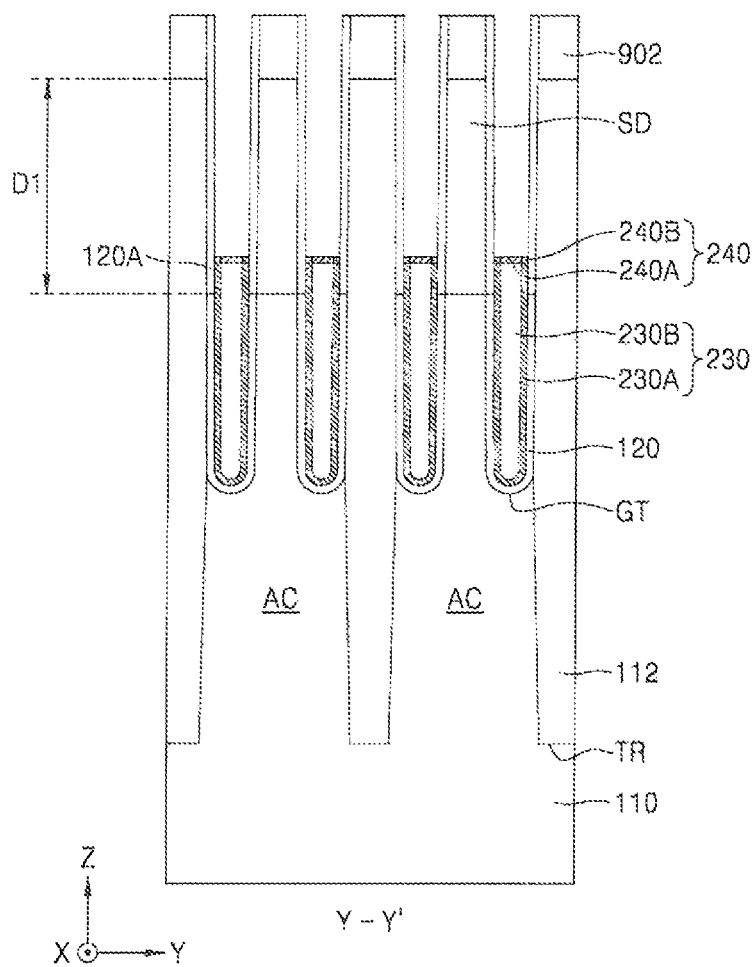

Referring to FIG. 9D, the resultant product of FIG. 9C may be subjected to a plasma treatment to form the first blocking layer 240 on the lower gate line 230 in each of the plurality of gate trenches GT and to form the first charge trapping region 120A in upper portions of each of a plurality of gate dielectric layers 120 through portions of the plurality of gate dielectric layers 120 exposed through the plurality of gate trenches GT.

In some embodiments, by performing a plasma nitration process using nitrogen-containing gas for the plasma treatment, it may be possible to trap nitrogen fixed charges in the first charge trapping region 120A. When the metal layer 230B includes W and the metal-containing liner 230A includes TiN, the inner metal-containing layer 240A may include a WN layer and the outer metal-containing layer 240B may include an N-rich TiN layer. However, the inventive concepts are not limited thereto. In order to perform the plasma nitration process, various processes including a nitration treatment performed by a rapid thermal processing (RTP) method in an NH3 atmosphere, an RTP process performed in a nitrogen-containing gas atmosphere such as $N_2$, NO or $N_2O$, a heat treatment process performed using a furnace, or a combination thereof may be performed.

In some embodiments, a plasma oxidation process may be performed to form the first blocking layer 240. When the metal layer 230B includes W and the metal-containing liner 230A includes TiN, the inner metal-containing layer 240A may include a WO layer and the outer metal-containing layer 240B may include a TiON layer.

According to the inventive concepts, fixed charges trapped in the first charge trapping region 120A are not limited to nitrogen fixed charges, and various fixed charges may be trapped. For example, fixed charges trapped in the first charge trapping region 120A of the plurality of gate dielectric layers 120 may be selected from elements nitrogen (N), hafnium (Hf), zirconium (Zr), lanthanum (La), magnesium (Mg), boron (B), aluminum (Al), phosphorus (P), arsenic (As), argon (Ar), and hydrogen (H), but the inventive concepts are not limited thereto.

Figure 9E:
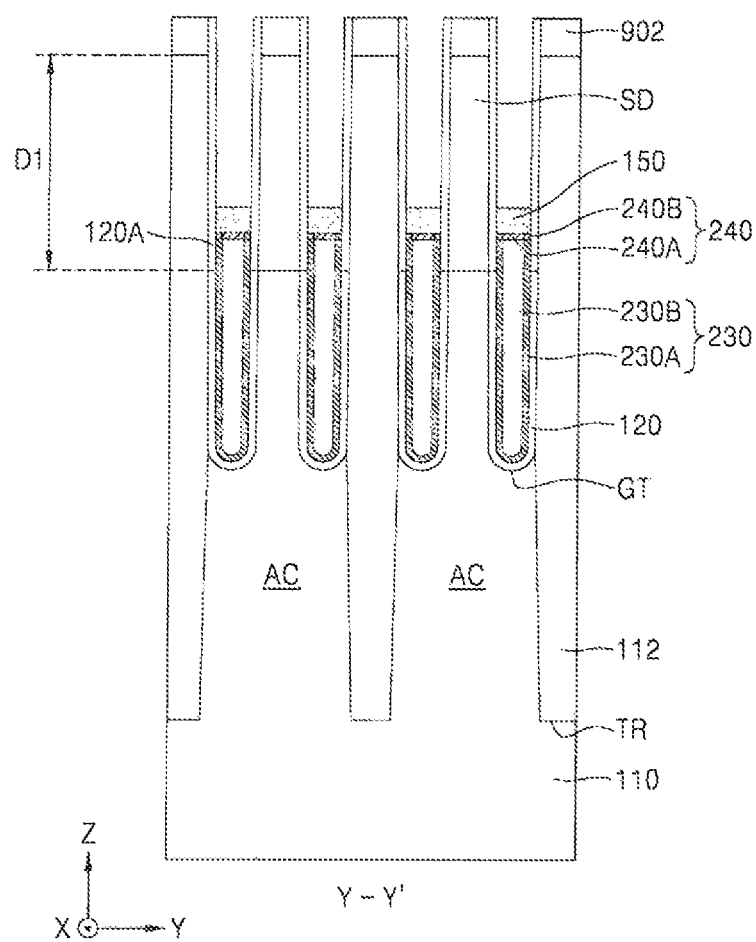

Referring to FIG. 9E, the upper gate line 150 may be formed on the first blocking layer 240 in each of the plurality of gate trenches GT.

In order to form the upper gate line 150, a preliminary upper gate line filling the plurality of gate trenches GT on top of the first blocking layer 240 and covering the upper surface of the plurality of mask line patterns 902 may be formed. Next, some portions of the preliminary upper gate line may be removed by an etch-back process so that the upper gate line 150 remains in each of the plurality of gate trenches GT. The plurality of mask line patterns 902 may be partially consumed while the portions of the preliminary upper gate lines are etched back so that a height of the plurality of mask line patterns 902 may be lowered.

Figure 9F:
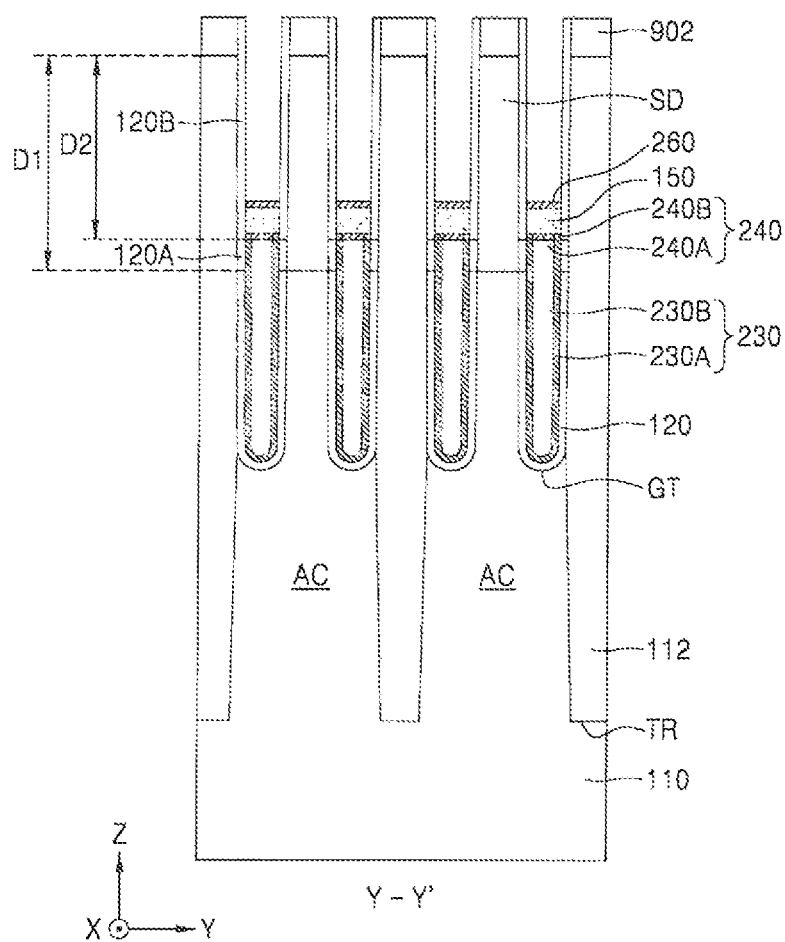

Referring to FIG. 9F, exposed upper surfaces of the upper gate lines 150 and exposed surfaces of the gate dielectric layers 120 may be subjected to plasma treatment through an inner space of each of the plurality of gate trenches GT to form the plurality of second blocking layers 260 covering the upper surface of the plurality of upper gate lines 150 and to form the second charge trapping region 120B in upper portions of each of the plurality of gate dielectric layers 120 through portions of the plurality of gate dielectric layers 120 exposed through the plurality of gate trenches GT. A specific method for the plasma treatment may be as described with reference to FIG. 9D.

In some embodiments, when the plurality of upper gate lines 150 include doped polysilicon, the plurality of second blocking layers 260 may be a silicon nitride layer, for example, an N-rich silicon nitride layer.

Figure 9G:
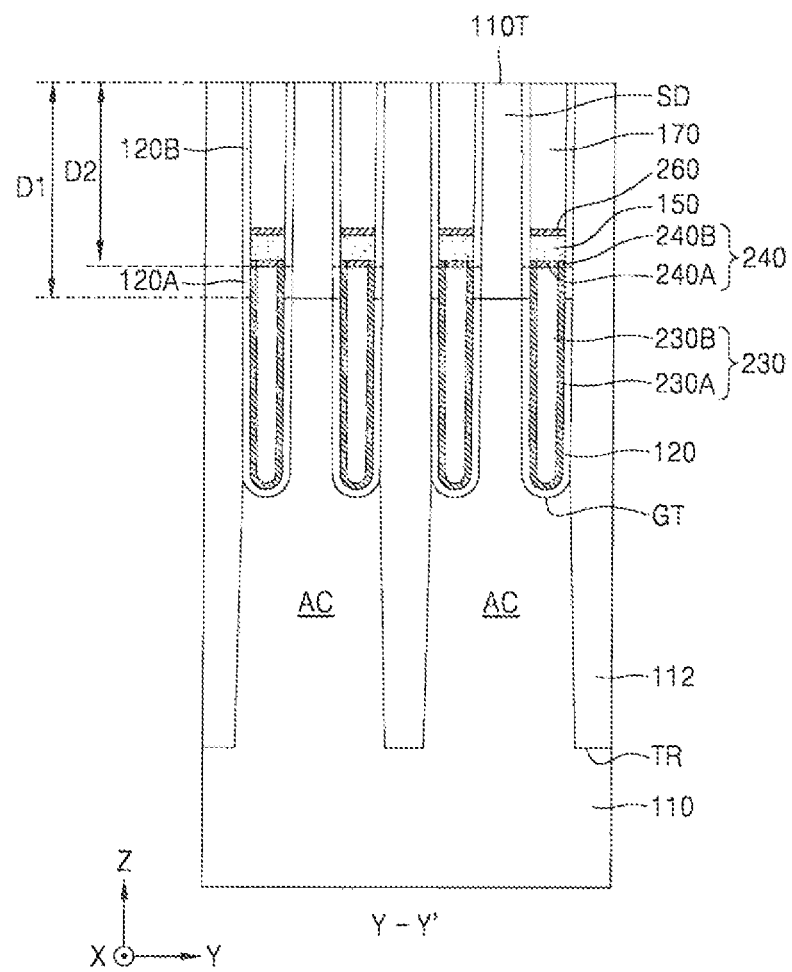

Referring to FIG. 9G, a space remaining on the second blocking layer 260 in an inner space of each of the plurality of gate trenches GT may be filled with the insulating capping pattern 170, and unnecessary layers remaining on the substrate 110 may be removed to expose the upper surface 110T of the substrate 110.

FIGS. 10A to 10D are cross-sectional views illustrating operations of methods of manufacturing integrated circuit devices, according to some embodiments of the inventive concepts, in a process sequence. Operations of methods of manufacturing the integrated circuit device 300 of FIG. 3 will be described with reference to FIGS. 10A to 10D. FIGS. 10A to 10D illustrate portions corresponding to the cross-section taken along the line Y-Y' of FIG. 1A, in a process sequence.

Figure 10A:
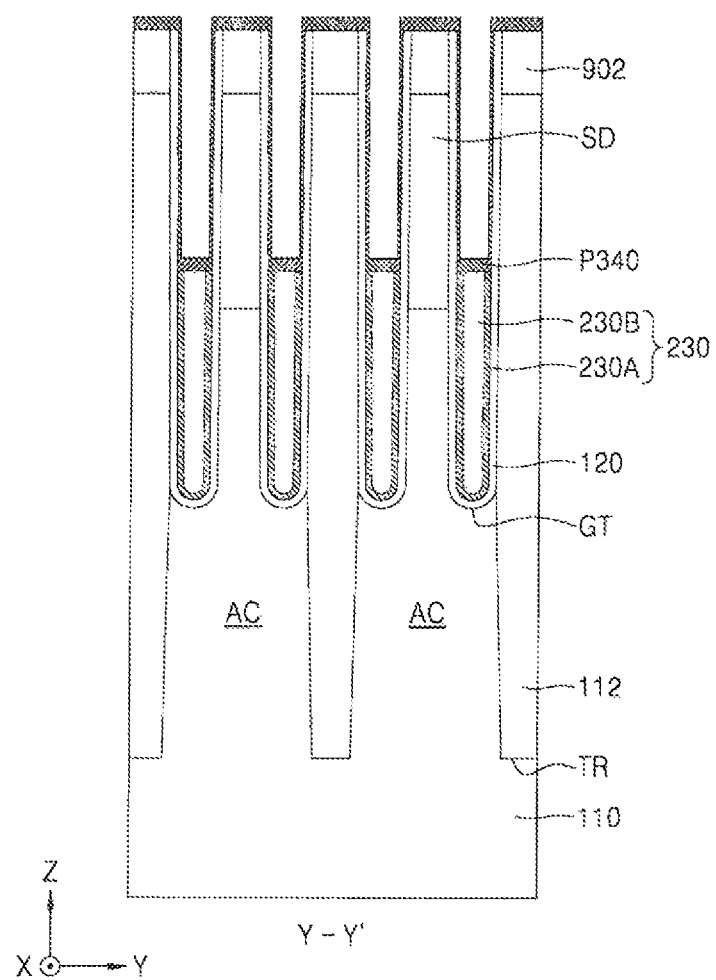
FIGS. 10A to 10D are cross-sectional views illustrating operations of methods of manufacturing integrated circuit devices, according to some embodiments of the inventive concepts, in a process sequence.

Referring to FIG. 10A, the isolation layer 112 defining the plurality of active regions AC may be formed on the substrate 110 and the gate dielectric layer 120 and the lower gate line 230 may be formed in each of the plurality of gate trenches GT, by the operations described with reference to FIGS. 9A to 9C.

Thereafter, a preliminary blocking layer P340 covering the upper surface of the lower gate line 230 in each of the plurality of gate trenches GT may be formed.

In some embodiments, the preliminary blocking layer P340 may be a metal nitride layer, for example, a TiN layer. A CVD or physical vapor deposition (PVD) process may be used to form the preliminary blocking layer P340. A thickness of the preliminary blocking layer P340 on the upper surface of the lower gate line 230 may be formed to be at least about three times greater than that on an inner sidewall of the gate trench GT. For this purpose, step coverage during a deposition process may be controlled.

Figure 10B:
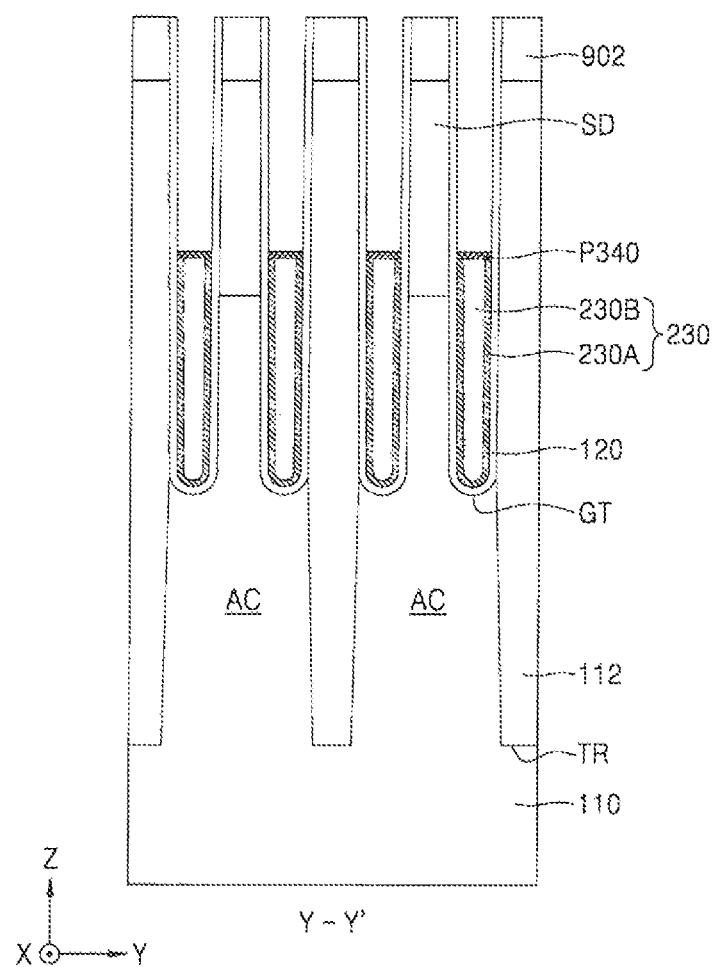

Referring to FIG. 10B, the preliminary blocking layer P340 may be partially etched to leave the preliminary blocking layer P340 only on the upper surface of the lower gate line 230 so that the inner sidewall of the gate trench GT is exposed again.

When the preliminary blocking layer P340 is a TiN layer, in order to ensure that the preliminary blocking layer P340 remains only on the upper surface of the lower gate line 230, in the resultant product of FIG. 10A, the preliminary blocking layer P340 may be wet-etched using etchant containing $NH_4OH$, $H_2O_2$, and $H_2O$, or etchant containing sulfuric acid. As a result, when all portions of the preliminary blocking layer P340 shown in FIG. 10A covering the inner sidewall of the gate trench GT may be removed and the inner sidewall of the gate trench GT may be exposed, a portion of the preliminary blocking layer P340 that covers the upper surface of the lower gate line 230 may remain without being removed. In some embodiments, a portion of the preliminary blocking layer P340 may remain on the upper surface of the plurality of mask line patterns 902. The remaining portion of the preliminary blocking layer P340 on the upper surface of the plurality of mask line patterns 902 may be removed through a subsequent process.

Figure 10C:
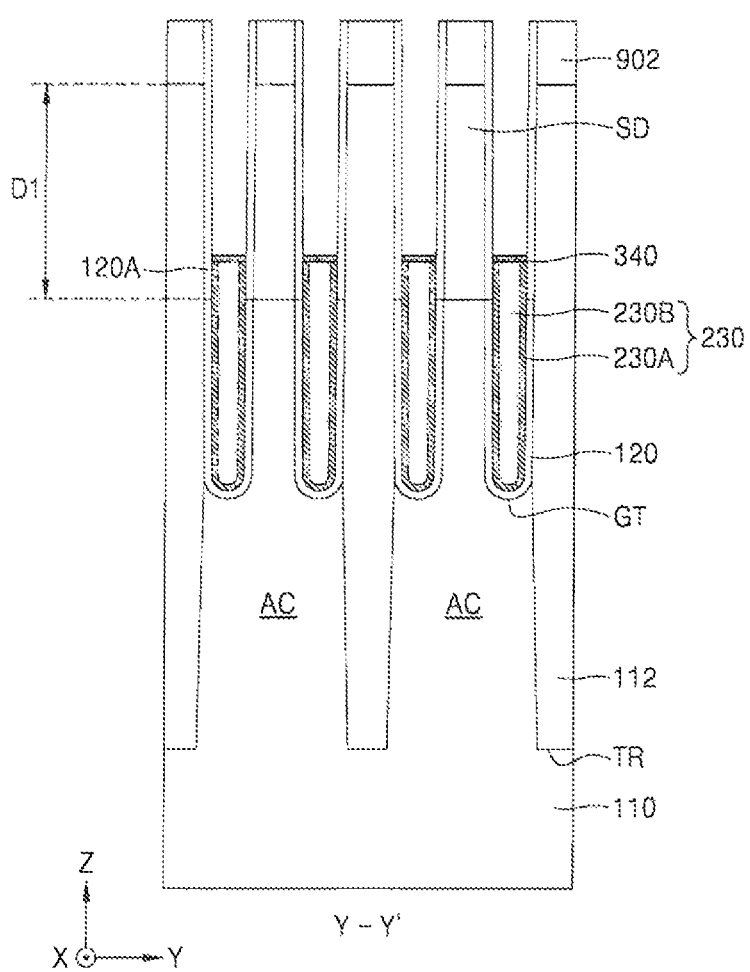

Referring to FIG. 10C, in a similar manner to the operations described with reference to FIG. 9D, the resultant product of FIG. 10B may be subjected to plasma treatment to form the plurality of first blocking layers 340 from the plurality of preliminary blocking layers P340 illustrated in FIG. 10B, and to form the first charge trapping region 120A in upper portions of each of the plurality of gate dielectric layers 120 through portions of the plurality of gate dielectric layers 120 exposed through the plurality of gate trenches GT.

By performing a plasma nitration process using nitrogen-containing gas for the plasma treatment, N atoms may be permeated into the plurality of preliminary blocking layers P340 illustrated in FIG. 10B. As a result, the first blocking layer 340 may have an increased N content than in the preliminary blocking layer P340. When the first blocking layer 340 is a TiN layer, at least a portion of a thickness from the upper surface of the first blocking layer 340 may be an N-rich TiN layer.

Figure 10D:
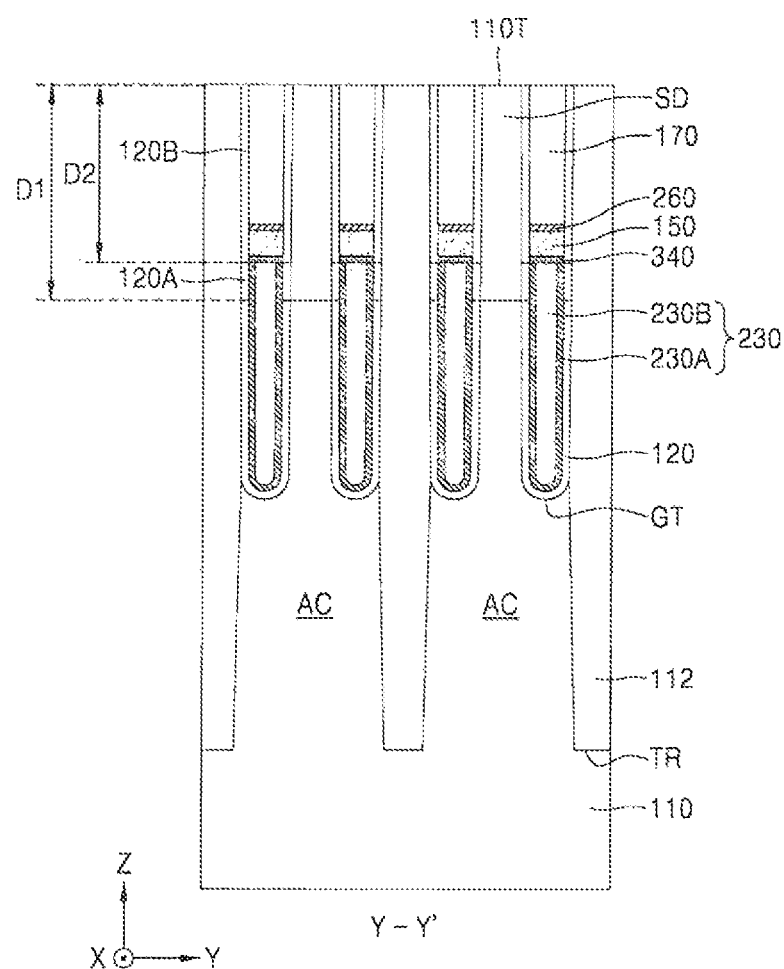

Referring to FIG. 10D, in a similar manner to the operations described with reference to FIGS. 9E to 9G, the upper gate line 150, the second blocking layer 260, and the insulating capping pattern 170 may be sequentially formed on the first blocking layer 340 in each of the plurality of gate trenches GT.

FIGS. 11A to 11D are cross-sectional views illustrating operations of methods of manufacturing integrated circuit devices, according to some embodiments of the inventive concepts, in a process sequence. Operations of methods of manufacturing the integrated circuit device 400 of FIG. 4 will be described with reference to FIGS. 11A to 11D. FIGS. 11A to 11D illustrate portions corresponding to the cross-section taken along the line Y-Y' of FIG. 1A, in a process sequence.

Figure 11A:
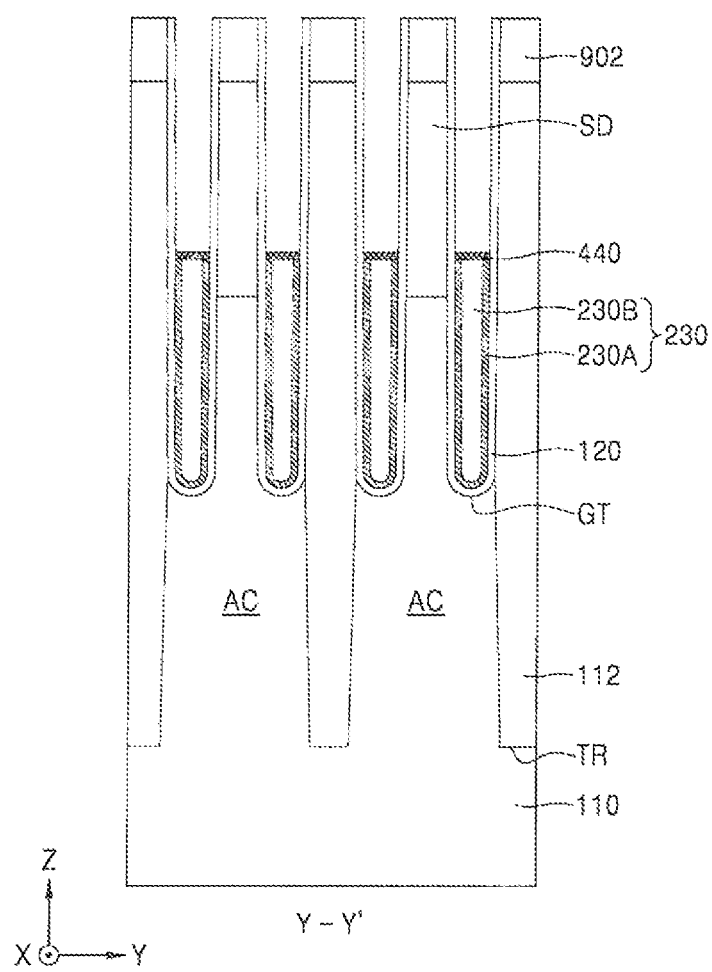
FIGS. 11A to 11D are cross-sectional views illustrating operations of methods of manufacturing integrated circuit devices, according to some embodiments of the inventive concepts, in a process sequence.

Referring to FIG. 11A, the isolation layer 112 defining the plurality of active regions AC may be formed on the substrate 110 and the gate dielectric layer 120 and the lower gate line 230 may be formed in each of the plurality of gate trenches GT, by the operations described with reference to FIGS. 9A to 9C. Thereafter, the first blocking layer 440 covering the upper surface of the lower gate line 230 in each of the plurality of gate trenches GT may be formed in the same manner as the operations of forming the preliminary blocking layer P340. In some embodiments, the first blocking layer 440 may be a metal nitride layer, for example, a TiN layer.

Figure 11B:
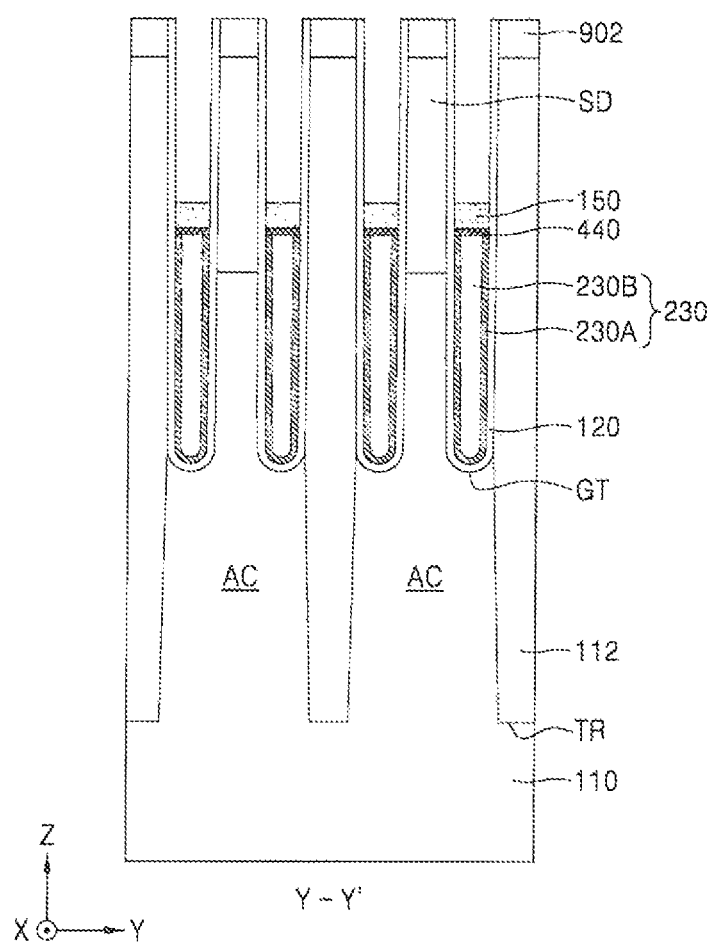

Referring to FIG. 11B, the upper gate line 150 may be formed on the first blocking layer 440 in each of the plurality of gate trenches GT in a similar manner to the operations described with reference to FIG. 9E.

Figure 11C:
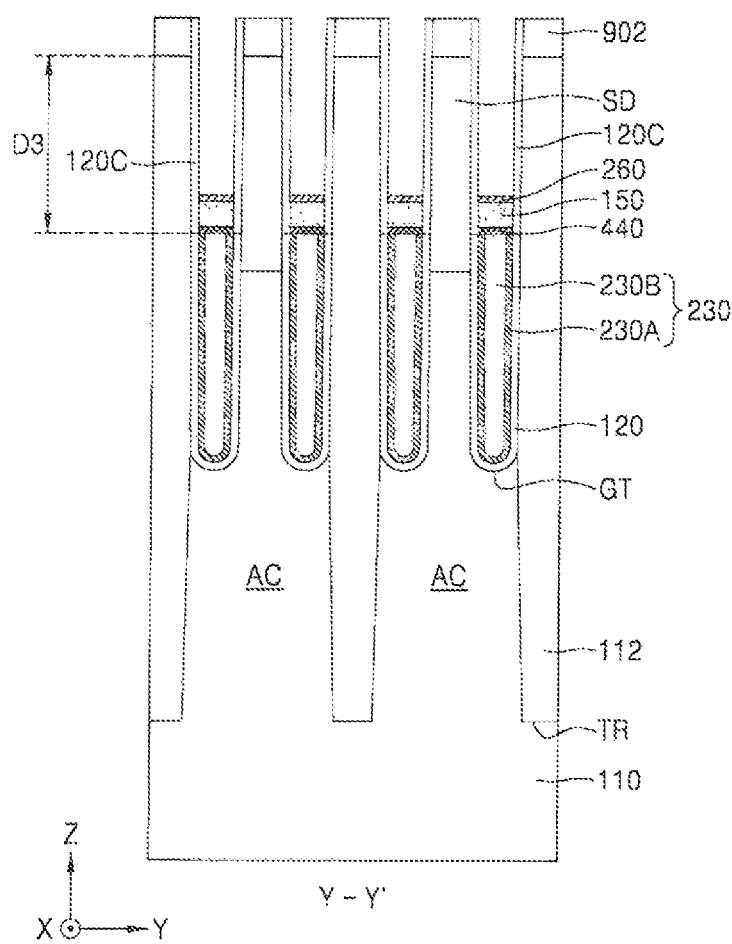

Referring to FIG. 11C, in a similar manner to the operations described with reference to FIG. 9F, the exposed upper surfaces of the upper gate lines 150 and the exposed surfaces of the gate dielectric layers 120 may be subjected to plasma treatment through the inner space of each of the plurality of gate trenches GT to form the plurality of second blocking layers 260 covering the upper surface of the plurality of upper gate lines 150 and to form the charge trapping region 120C in upper portions of each of the plurality of gate dielectric layers 120 through portions of each of the plurality of gate dielectric layers 120 exposed through the plurality of gate trenches GT.

Figure 11D:
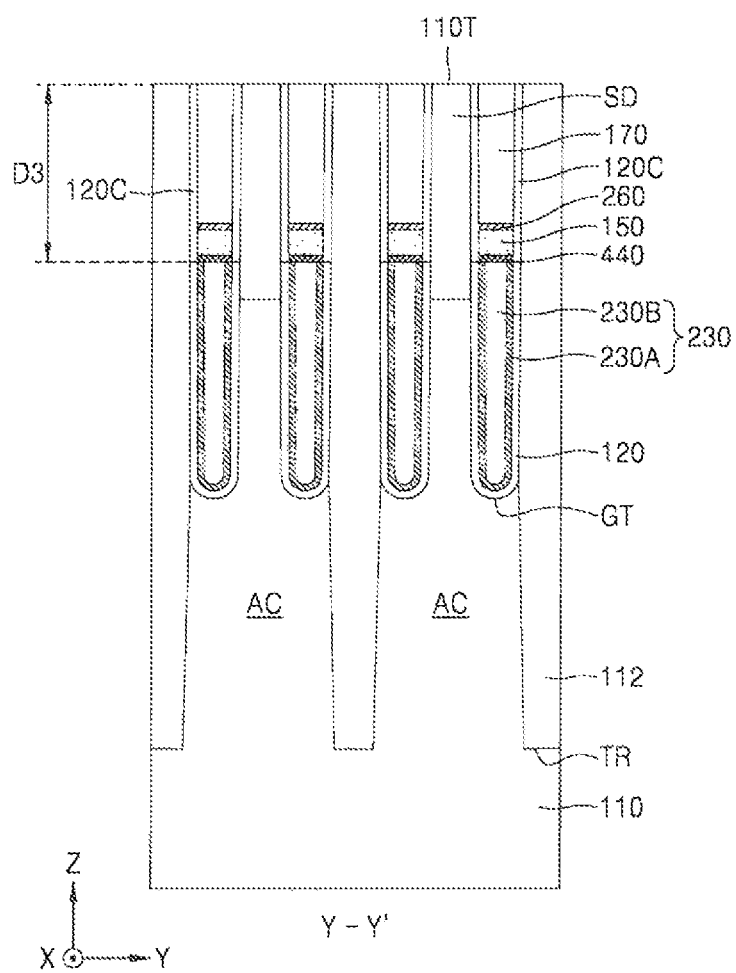

Referring to FIG. 11D, by the operations described with reference to FIG. 9G, the insulating capping pattern 170 covering the second blocking layer 260 may be formed in the plurality of gate trenches GT.

Figure 12A:
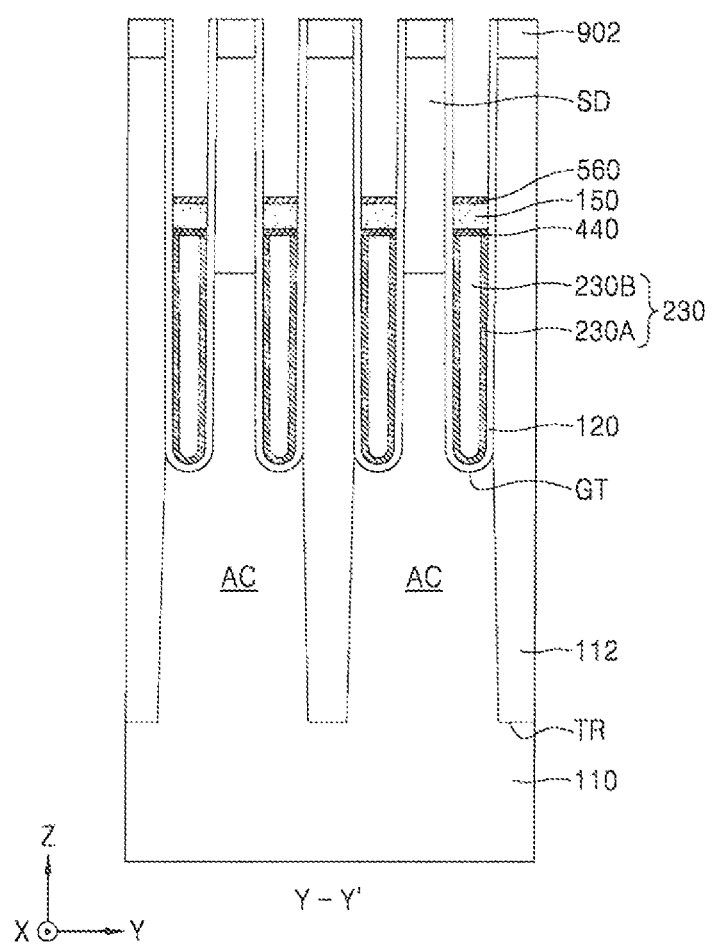
FIGS. 12A and 12B are cross-sectional views illustrating operations of methods of manufacturing integrated circuit devices, according to some embodiments of the inventive concepts, in a process sequence.
Figure 12B:
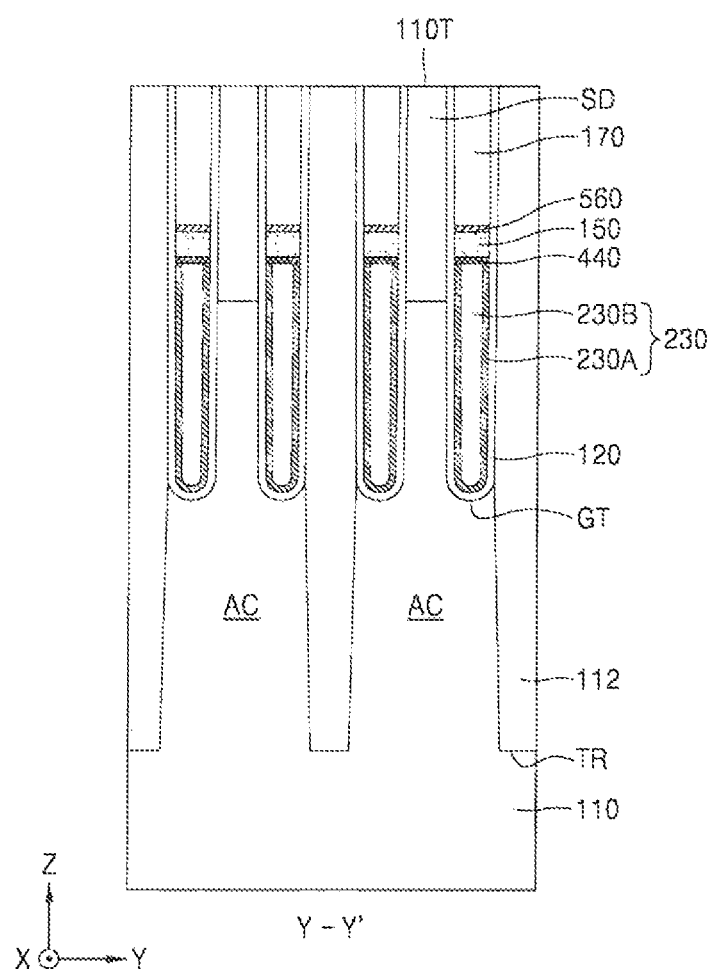

FIGS. 12A and 12B are cross-sectional views illustrating operations of methods of manufacturing integrated circuit devices, according to some embodiments of the inventive concepts, in a process sequence. Operations of methods of manufacturing the integrated circuit device 500 of FIG. 5 will be described with reference to FIG. 12A and FIG. 12B. FIGS. 12A and 12B illustrate portions corresponding to the cross-section taken along the line Y-Y' of FIG. 1A, in a process sequence.

Referring to FIG. 12A, the isolation layer 112 defining the plurality of active regions AC may be formed on the substrate 110, and the gate dielectric layer 120, the lower gate line 230, the first blocking layer 440, and the upper gate line 150 may be sequentially formed in each of the plurality of gate trenches GT, as described with reference to FIGS. 11A and 11B.

Thereafter, the second blocking layer 560 covering the upper surface of the upper gate line 150 in each of the plurality of gate trenches GT may be formed. In order to form the second blocking layer 560, a preliminary second blocking layer covering the upper surface of the upper gate line 150 and a surface of the gate dielectric layer 120 exposed in each of the plurality of gate trenches GT may be formed by a CVD or PVD process. Thereafter, a portion of the preliminary second blocking layer may be removed by dry etching or wet etching so that only the second blocking layer 560 may be left. For example, the second blocking layer 560 may include a nitride layer, an oxide layer, or a combination thereof.

Referring to FIG. 12B, the insulating capping pattern 170 may be formed on the second blocking layer 560 in each of the plurality of gate trenches GT in a similar manner to the operations described with reference to FIG. 9G.

In some methods of manufacturing the integrated circuit device 600 described with reference to FIG. 6, the isolation layer 112 defining the plurality of active regions AC may be formed on the substrate 110, and the gate dielectric layer 120, the lower gate line 230, the first blocking layer 240, and the upper gate line 150 may be formed in the gate trench GT, as described with reference to FIGS. 9A to 9E. At the same time as the formation of the first blocking layer 240, the charge trapping region 120D may be formed on the gate dielectric layer 120. Thereafter, the insulating capping pattern 170 covering the second blocking layer 660 may be formed in a similar manner to that described with reference to FIG. 9G after the second blocking layer 660 covering the upper gate line 150 in the gate trench GT may be formed in a similar manner to the operations of forming the second blocking layer 560 with reference to FIG. 12A.

In some methods for manufacturing an integrated circuit device 700 illustrated in FIG. 7, the isolation layer 112 defining the plurality of active regions AC may be formed on the substrate 110 in the same manner as described with reference to FIGS. 10A to 10C, and the gate dielectric layer 120, the lower gate line 230, and the first blocking layer 340 may be formed in the gate trench GT. At the same time as the formation of the first blocking layer 340, the charge trapping region 120E may be formed in upper portions of each of the gate dielectric layer 120. Thereafter, the upper gate line 150 covering the first blocking layer 340 in the gate trench GT may be formed in the same manner as described with reference to FIG. 9E. The insulating capping pattern 170 covering the second blocking layer 660 may be formed in a similar manner to that described with reference to FIG. 9G after the second blocking layer 660 covering the upper gate line 150 in the gate trench GT may be formed in a similar manner to the operations of forming the second blocking layer 560 with reference to FIG. 12A.

In some methods for manufacturing the integrated circuit device 800 illustrated in FIG. 8, the isolation layer 112 defining the plurality of active regions AC may be formed on the substrate 110 in the same manner as described with reference to FIGS. 9A to 9C, and the gate dielectric layer 120 and the lower gate line 230 may be formed in each of the gate trenches GT. Then, the process of forming the first blocking layer 240 and the first charge trapping region 120A described with reference to FIG. 9D may be omitted, and the upper gate line 150 contacting the lower gate line 230 in the gate trench GT may be formed in the same manner as described with reference to FIG. 9E. Thereafter, the second blocking layer 260 may be formed by the operations described with reference to FIG. 9F. At the same time as the formation of the second blocking layer 260, the charge trapping region 120F may be formed in each of the gate dielectric layer 120. Thereafter, the insulating capping pattern 170 covering the second blocking layer 260 may be formed in a manner similar to that described with reference to FIG. 9G.

Although the integrated circuit devices 100, 200, 300, 400, 500, 600, 700, and 800 and the exemplary manufacturing methods thereof have been described with reference to FIGS. 1A to 12B, it will be understood by those skilled in the art that various changes and modifications may be made within the scope of the inventive concepts as described with reference to FIGS. 1A to 12B to provide integrated circuit devices having various structures and methods of manufacturing the same.

Figure 13:
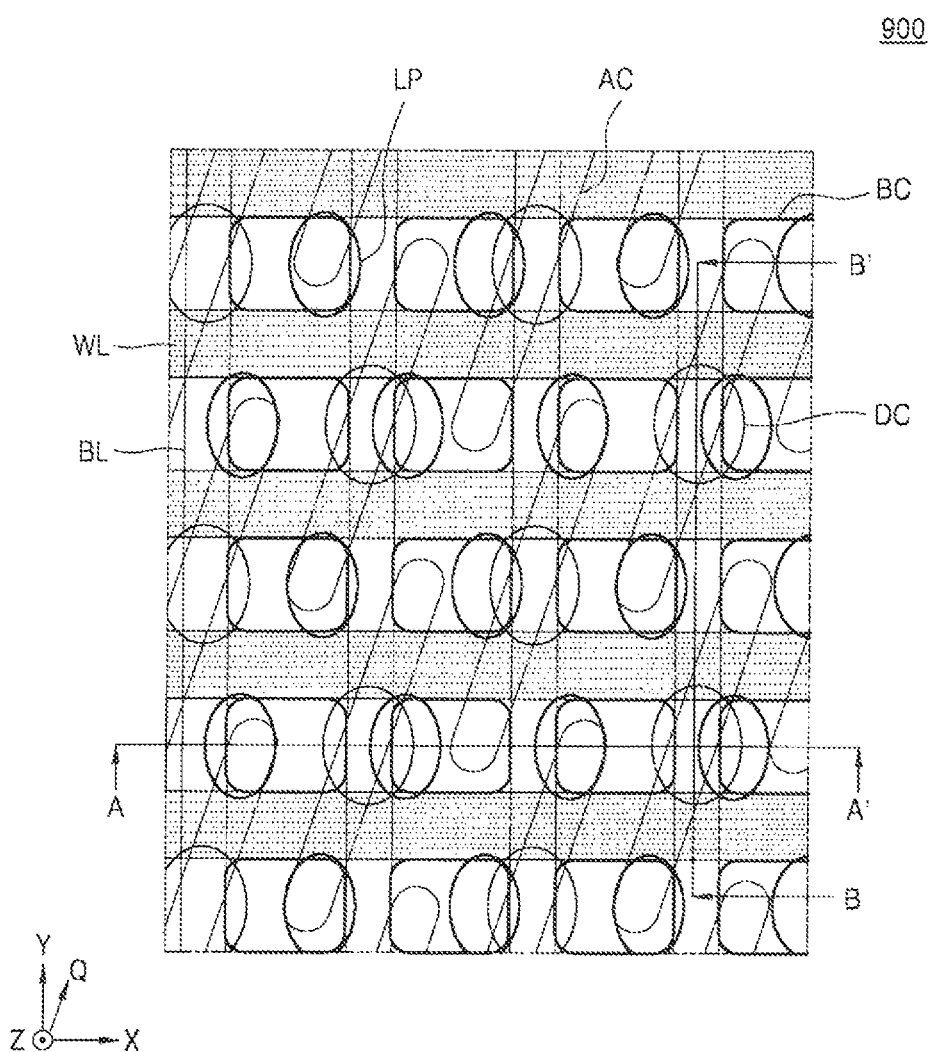
FIG. 13 is a plan view illustrating a cell array region of an integrated circuit device according to some embodiments of the inventive concepts.

FIG. 13 is a plan view illustrating a cell array region of an integrated circuit device according to some embodiments of the inventive concepts.

Referring to FIG. 13, a cell array region of an integrated circuit device 900 may include a plurality of active regions AC. A plurality of word lines WL may extend parallel to each other across the plurality of active regions AC in the X direction. A plurality of bit lines BL may extend parallel to each other on the plurality of word lines WL in the Y direction. The plurality of bit lines BL may be connected to the plurality of active regions AC via a direct contact DC.

A plurality of buried contacts BC may be formed between two neighboring bit lines BL among the plurality of bit lines BL. The plurality of buried contacts BC may be arranged in a line along the X direction and the Y direction. A plurality of landing pads LP may be formed on the plurality of buried contacts BC. The plurality of buried contacts BC and the plurality of landing pads LP may connect a lower electrode of a capacitor formed on the bit lines BL to the plurality of active regions AC. The plurality of landing pads LP may be disposed to partially overlap the plurality of buried contacts BC, respectively.

FIGS. 14A to 14H are cross-sectional views illustrating operations of methods of manufacturing integrated circuit devices, according to some embodiments of the inventive concepts, in a process sequence. Methods of manufacturing the integrated circuit device 900 of FIG. 13 will be described with reference to FIGS. 14A to 14H. FIGS. 14A to 14H illustrate portions corresponding to cross-sections taken along lines A-A' and B-B' of FIG. 13, in a process sequence.

Figure 14A:
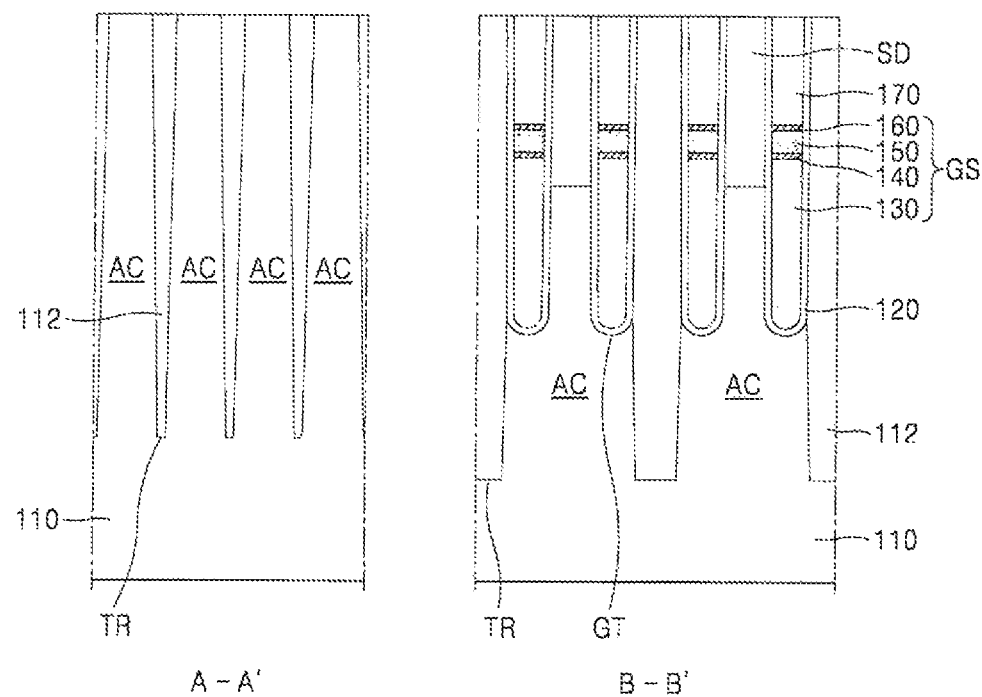
FIGS. 14A to 14H are cross-sectional views illustrating operations of methods of manufacturing integrated circuit devices, according to some embodiments of the inventive concepts, in a process sequence.

Referring to FIG. 14A, the plurality of isolation trenches TR may be formed in a cell array region of the substrate 110, and the plurality of isolation layers 112 filling the isolation trench TR may be formed. The plurality of active regions AC may be defined in the cell array region of the substrate 110 by the plurality of isolation layers 112.

The plurality of gate trenches GT extending in parallel to each other may be formed on the substrate 110 after a plurality of source/drain regions are formed by implanting impurity ions into an upper surface of the plurality of active regions AC. The gate dielectric layer 120, the gate structure GS, and the insulating capping pattern 170 may be formed in each of the plurality of gate trenches GT after cleaning the resultant product including the plurality of gate trenches GT. The plurality of gate structures GS may constitute the plurality of word lines WL illustrated in FIG. 13. In this example, the gate structure GS illustrated in FIG. 1B may be formed in each of the gate trenches GT, but the inventive concepts are not limited thereto. For example, this example may include, instead of the gate structure GS, the gate structures GS2, GS3, GS4, GS5, GS6, GS7, and GS8 illustrated in FIGS. 2 to 8 and any one gate structure selected from among gate structures having various structures modified and changed from the above gate structures within the scope of the inventive concepts.

Figure 14B:
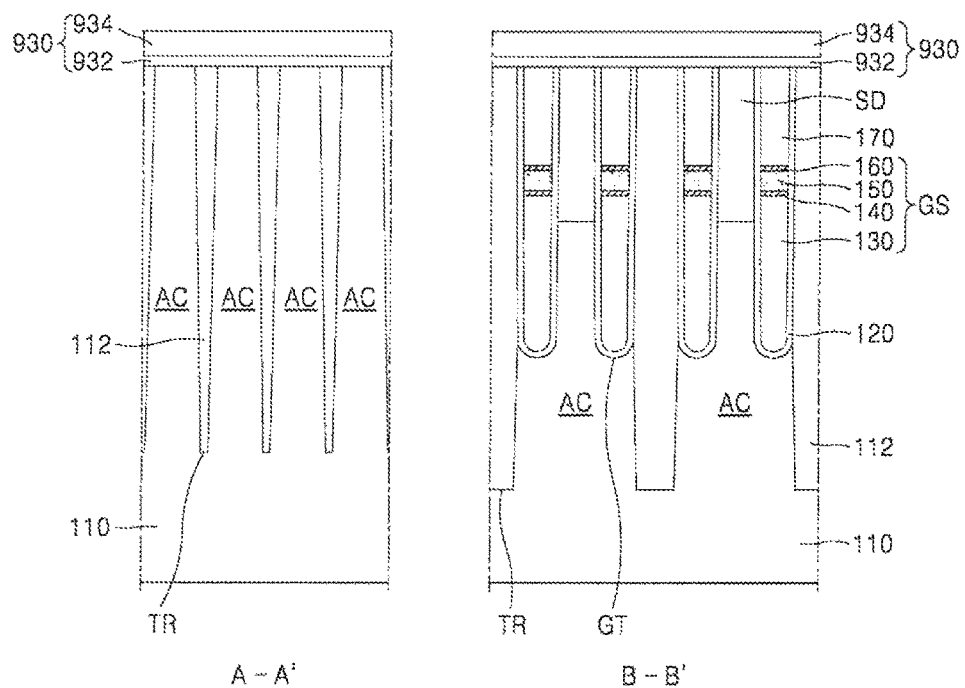

Referring to FIG. 14B, an insulating layer 930 may be formed on the substrate 110. The insulating layer 930 may include a first insulating layer 932 and a second insulating layer 934 sequentially formed on the substrate 110. The first insulating layer 932 and the second insulating layer 934 may include different kinds of insulating materials. For example, the first insulating layer 932 may be an oxide layer, and the second insulating layer 934 may be a nitride layer, but the inventive concepts are not limited thereto.

Figure 14C:
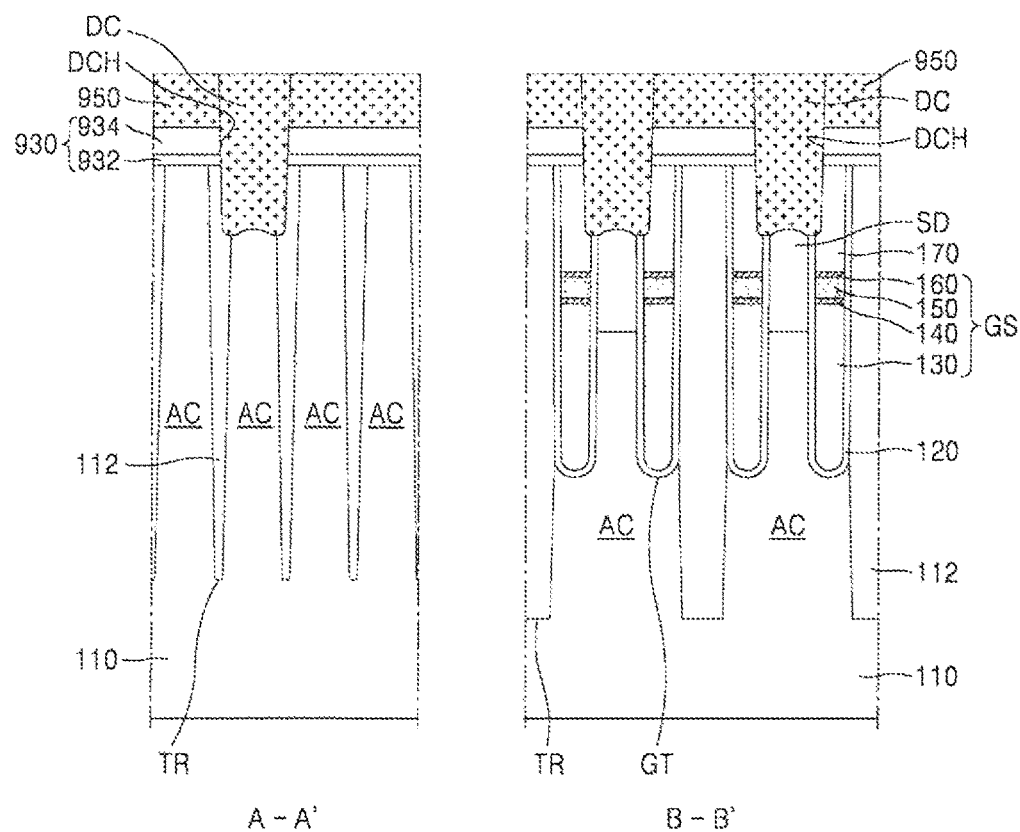

Referring to FIG. 14C, after a first conductive layer 950 may be formed on the substrate 110, a portion of each of the first conductive layer 950, the second insulating layer 934, and the first insulating layer 932 and a portion of the substrate 110 may be etched to form a plurality of direct contact holes DCH which expose the active region AC through the first conductive layer 950, the second insulating layer 934, and the first insulating layer 932. Thereafter, a plurality of direct contacts DC filling the plurality of direct contact holes DCH may be formed.

The first conductive layer 950 may include doped polysilicon or metal such as W, molybdenum (Mo), gold (Au), copper (Cu), Al, nickel (Ni), or cobalt (Co). The first conductive layer 950 may be a monolayer including a single material selected from the above-exemplified materials, or a multilayer including at least two kinds of materials.

A direct contact DC may include doped polysilicon or metal such as W, Mo, Au, Cu, Al, Ni, or Co. In some embodiments, the direct contact DC may include the same material as that of the first conductive layer 950.

In some embodiments, a metal silicide layer may further be formed between the substrate 110 and the direct contact DC. For example, the metal silicide layer may include tungsten silicide, nickel silicide, or cobalt silicide, but the inventive concepts are not limited thereto.

Figure 14D:
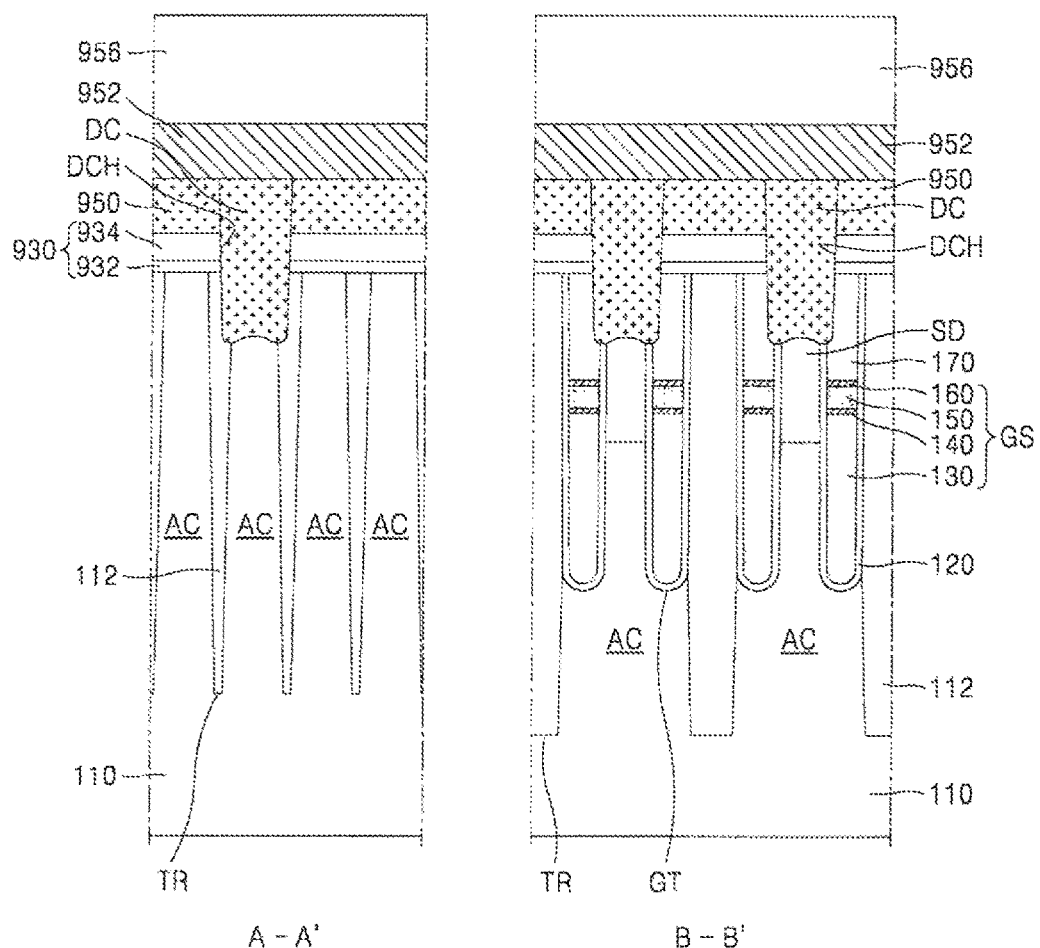

Referring to FIG. 14D, a second conductive layer 952 and an insulating capping layer 956 extending over the first conductive layer 950 may be sequentially formed.

The second conductive layer 952 may include TiSiN, TiN, TaN, CoN, metal, metal silicide, or a combination thereof. The metal and the metal silicide may include W, Mo, Au, Cu, Al, Ni, or Co. The insulating capping layer 956 may include a silicon nitride layer.

Figure 14E:
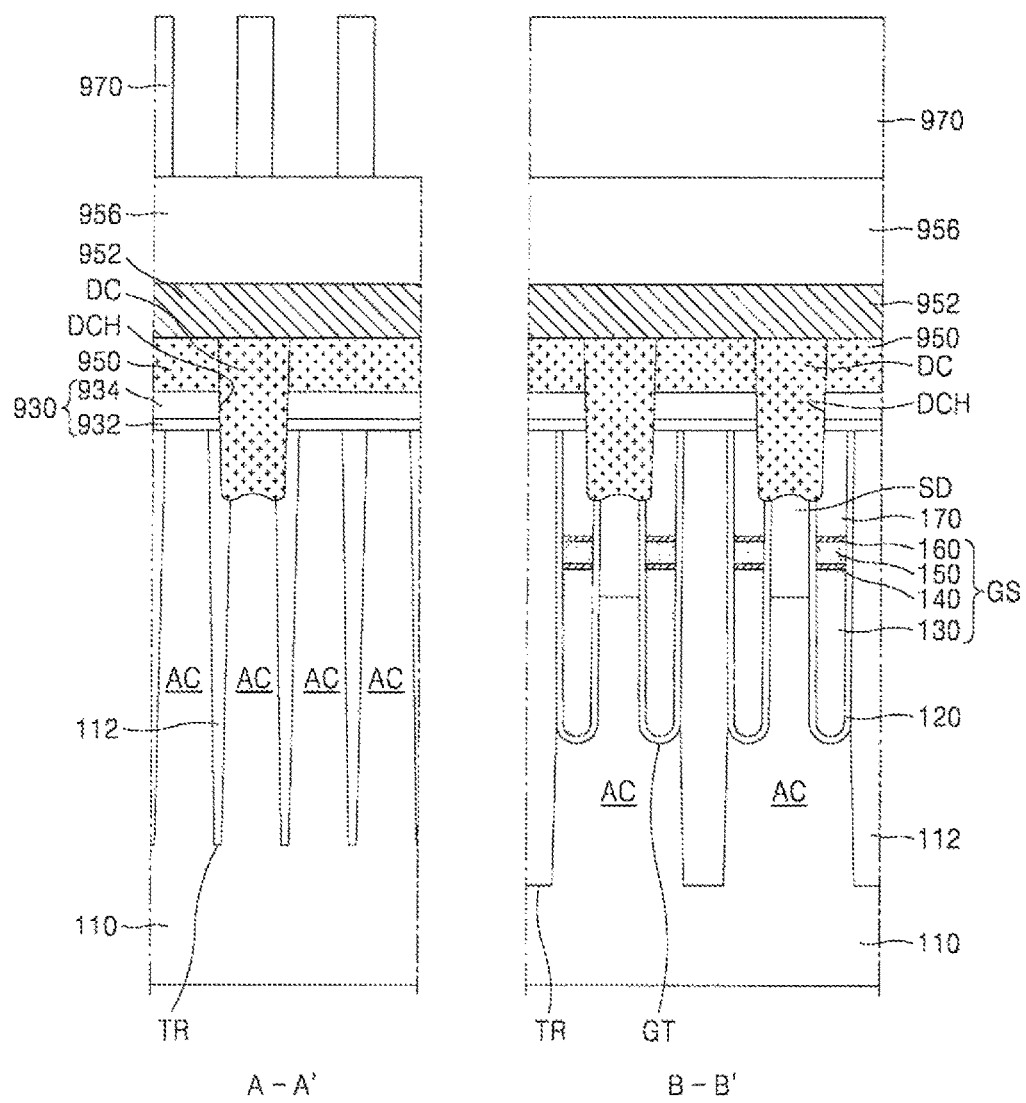

Referring to FIG. 14E, a mask pattern 970 may be formed on the insulating capping layer 956. An upper surface of the insulating capping layer 956 may be partially exposed through the mask pattern 970. The mask pattern 970 may include a silicon nitride layer.

Figure 14F:
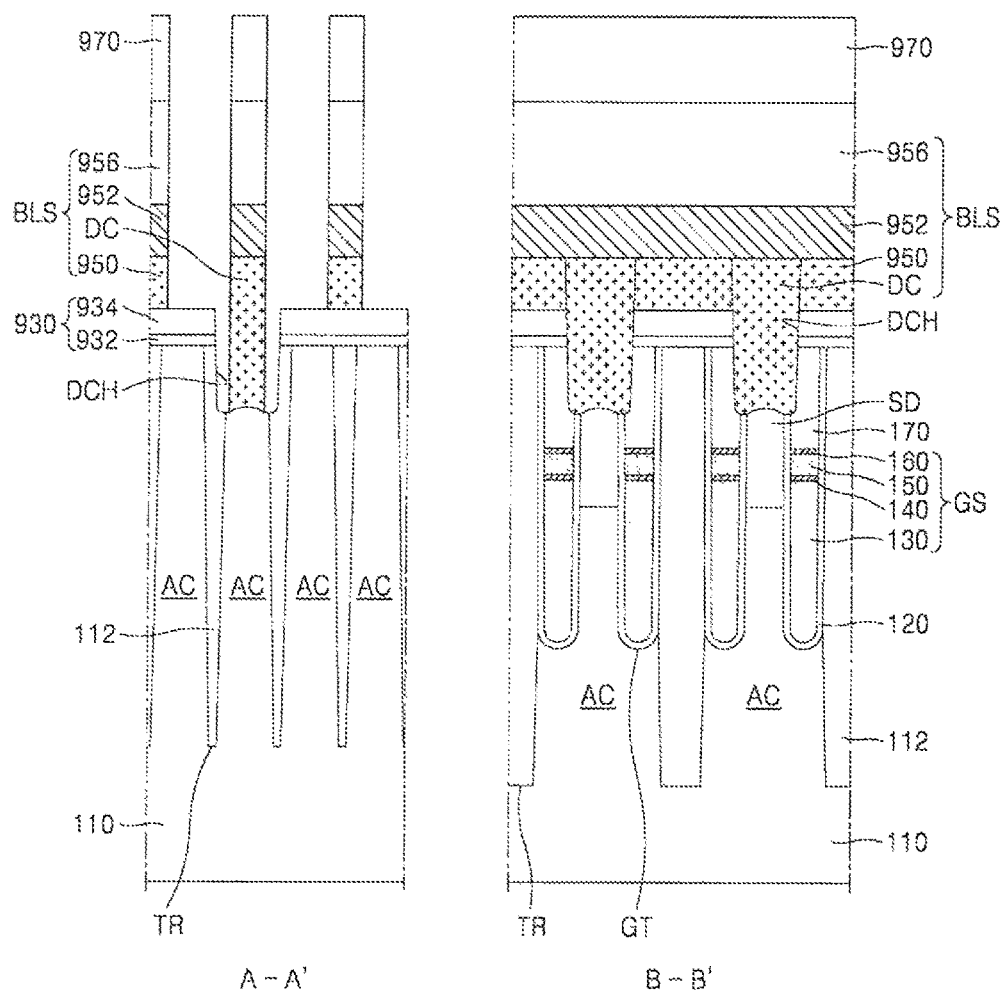

Referring to FIG. 14F, a stacked structure including the direct contact DC, the first conductive layer 950, the second conductive layer 952, and the insulating capping layer 956 may be etched using the mask pattern 970 as an etching mask to form a plurality of bit line structures BLS extending in parallel to each other. The first conductive layer 950 and the second conductive layer 952 included in the plurality of bit line structures BLS may constitute a bit line BL illustrated in FIG. 13.

Figure 14G:
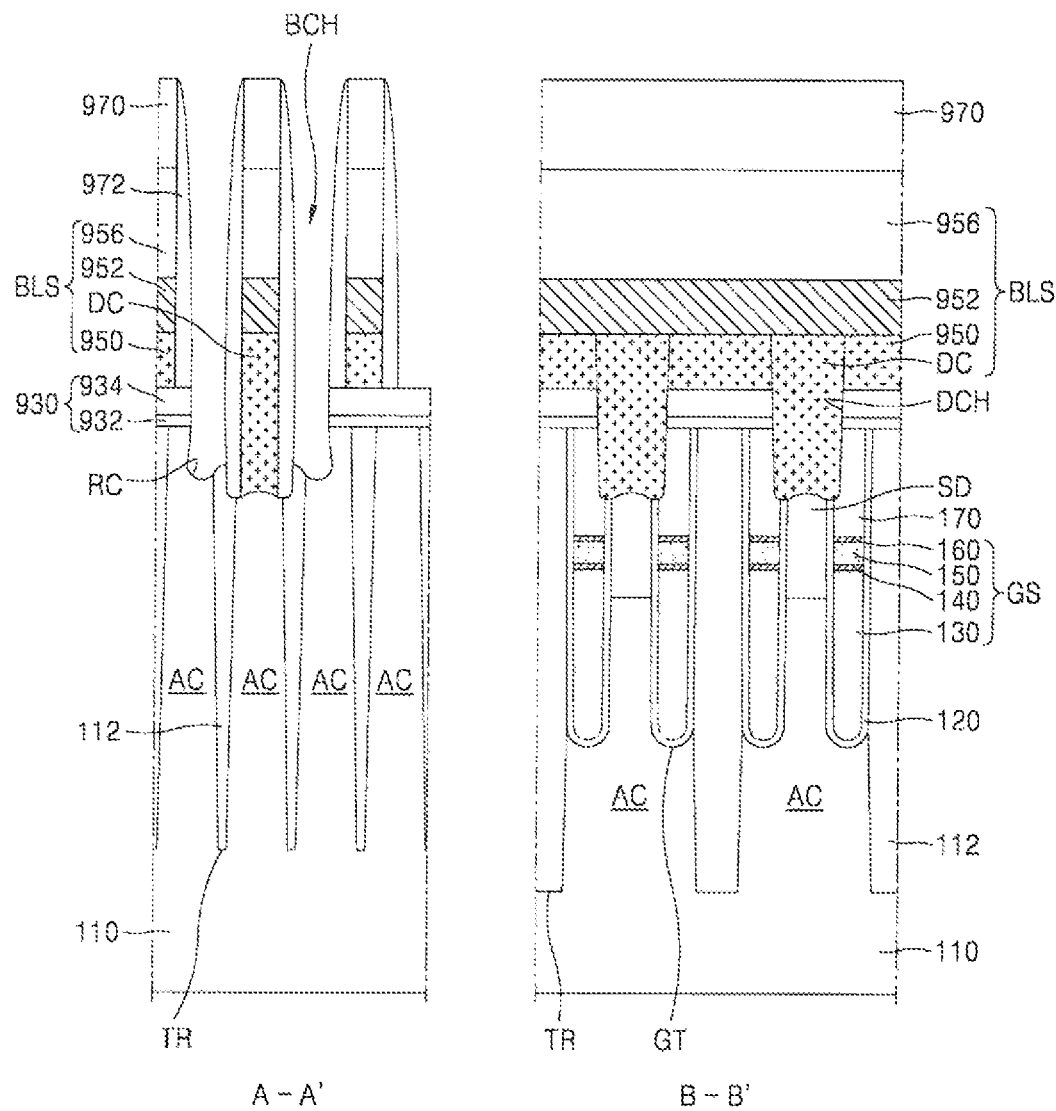

Referring to FIG. 14G, a plurality of insulating spacers 972 covering both sidewalls of each of the plurality of bit line structures BLS may be formed, and a plurality of recesses RC exposing the plurality of active regions AC may be formed by etching a portion of the substrate 110 and a portion of the isolation layer 112 that are exposed through the plurality of insulating spacers 972. Each of the plurality of recesses RC may be communicated with a buried contact hole BCH whose width may be limited by a pair of insulating spacers 972 between two neighboring bit line structures BLS.

In order to form the plurality of insulating spacers 972 and the plurality of recesses RC, processes of forming a spacer insulating layer covering the plurality of bit line structures BLS and etching back the spacer insulating layer, and a process of partially etching the substrate 110 and the isolation layer 112 may be performed.

Figure 14H:
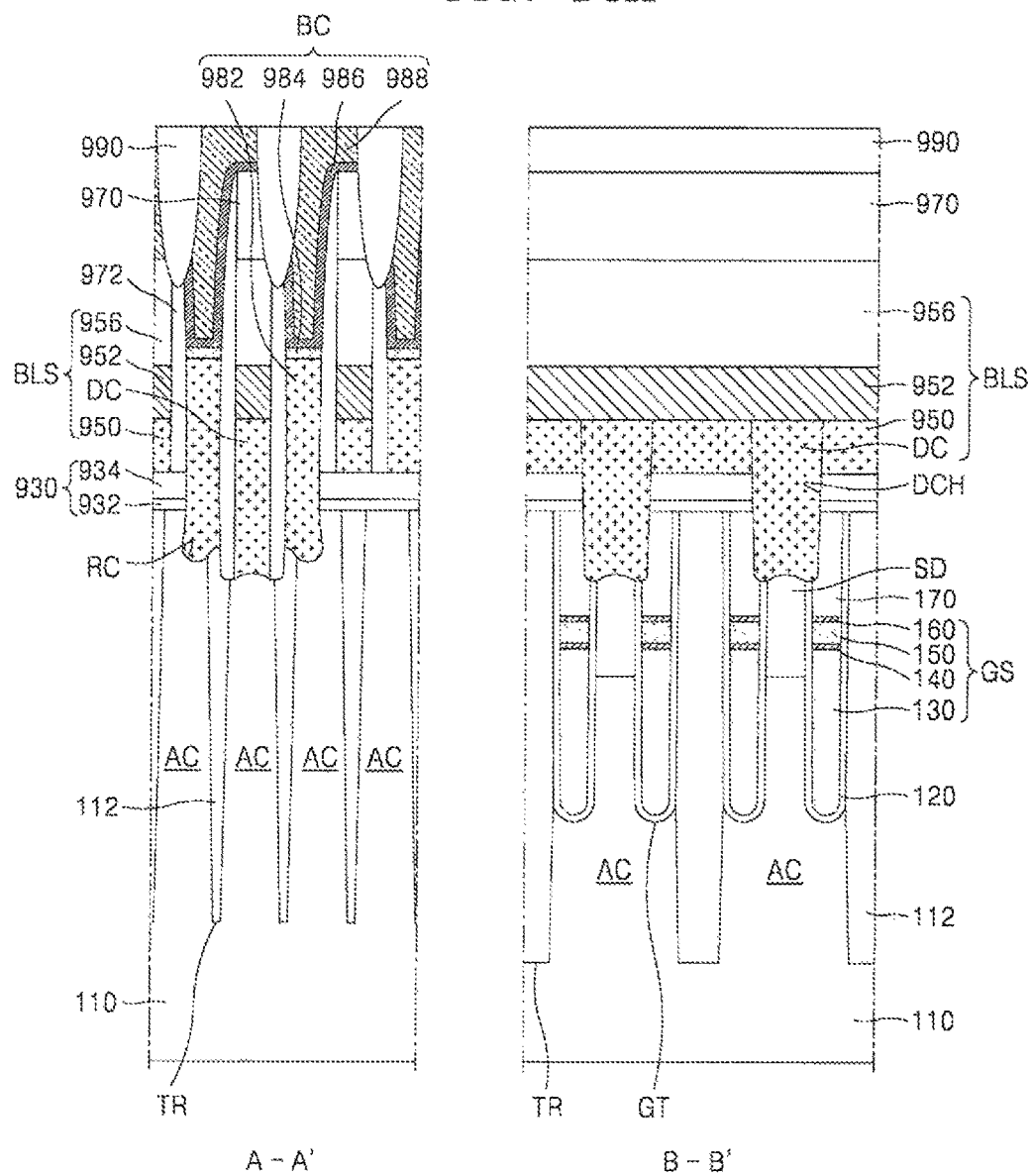

Referring to FIG. 14H, a buried conductive layer 982, a metal silicide layer 984, a conductive barrier layer 986, and an upper conductive layer 988, which are sequentially stacked in the plurality of buried contact holes BCH while filling the plurality of recesses RC between each of the plurality of bit line structures BLS, may be formed. The buried conductive layer 982, the metal silicide layer 984, the conductive barrier layer 986, and the upper conductive layer 988 may constitute a buried contact BC. Furthermore, portions of a plurality of upper conductive layers 988 extending over the upper surface of the plurality of bit line structures BLS may be used as a plurality of landing pads to which lower electrodes of capacitors formed in a subsequent process may be connected, and may correspond to the plurality of landing pads LP described with reference to FIG. 13.

A plurality of buried conductive layers 982 may be formed by a chemical vapor deposition (CVD), physical vapor deposition (PVD), or epitaxial growth process. The plurality of buried conductive layers 982 may include an impurity-doped semiconductor material, metal, conductive metal nitride, metal silicide, or a combination thereof. The plurality of metal silicide layers 984 may include cobalt silicide, nickel silicide, or manganese silicide. In some embodiments, the metal silicide layer 984 may be omitted.

The plurality of conductive barrier layers 986 may be formed of a Ti/TiN stacked structure. The plurality of upper conductive layers 988 may include doped polysilicon, metal, metal silicide, conductive metal nitride, or a combination thereof. For example, the plurality of upper conductive layers 988 may include W. The plurality of upper conductive layers 988 may be electrically insulated from each other by an insulating layer 990 filling spaces around them.

Thereafter, a plurality of capacitor lower electrodes electrically connectable to the plurality of upper conductive layers 988 may be formed on the insulating layer 990.

FIGS. 15A to 15D are cross-sectional views illustrating operations of methods of manufacturing integrated circuit devices, according to some embodiments of the inventive concepts, in a process sequence. FIG. 15A to 15D illustrate a configuration corresponding to a cross-section along the X direction in FIG. 13.

Figure 15A:
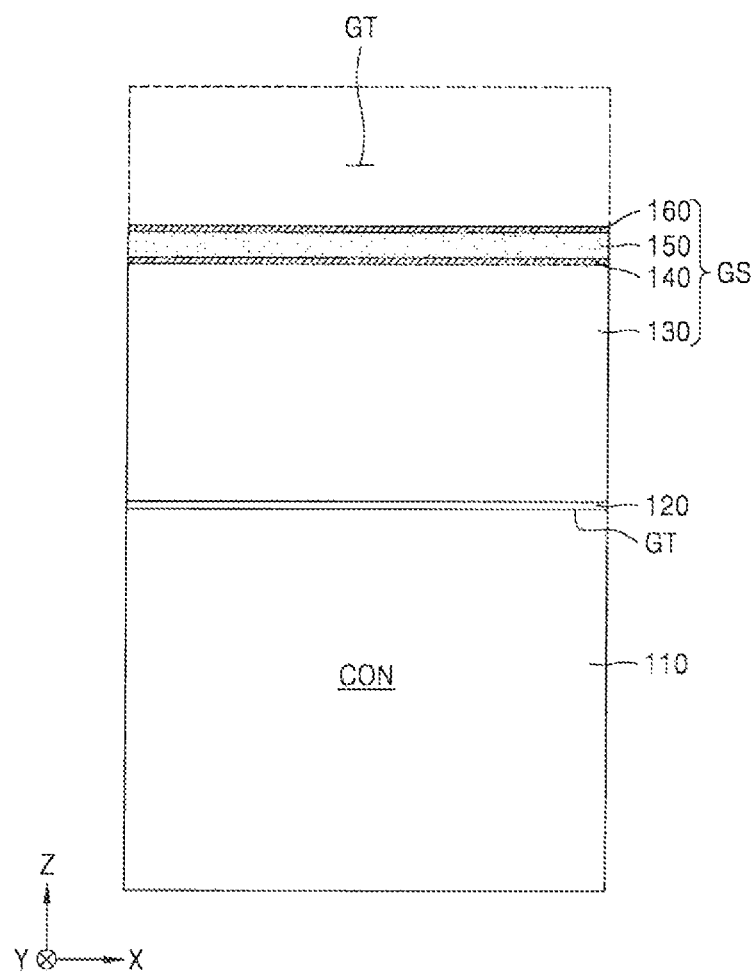
FIGS. 15A to 15D are cross-sectional views illustrating operations of methods of manufacturing integrated circuit devices, according to some embodiments of the inventive concepts, in a process sequence.

Referring to FIG. 15A, the substrate 110 may have a connection region CON. The connection region CON may be a region for providing a connection wiring between a cell array region of the integrated circuit device 900 illustrated in FIG. 13 and a peripheral circuit region near the cell array region, which may be disposed in an edge portion of the cell array region or between the peripheral circuit region and the cell array region.

As described above with reference to FIG. 14A, the plurality of isolation layers 112 may be formed on the substrate 110, the plurality of gate trenches GT may be formed, and then the resultant product having the plurality of gate trenches GT may be cleaned. Thereafter, the gate dielectric layer 120 may be formed in the plurality of gate trenches GT, and the gate structure GS including the lower gate line 130, the first blocking layer 140, the upper gate line 150, and the second blocking layer 160 may be formed. The first blocking layer 140 may include a TiN layer.

Figure 15B:
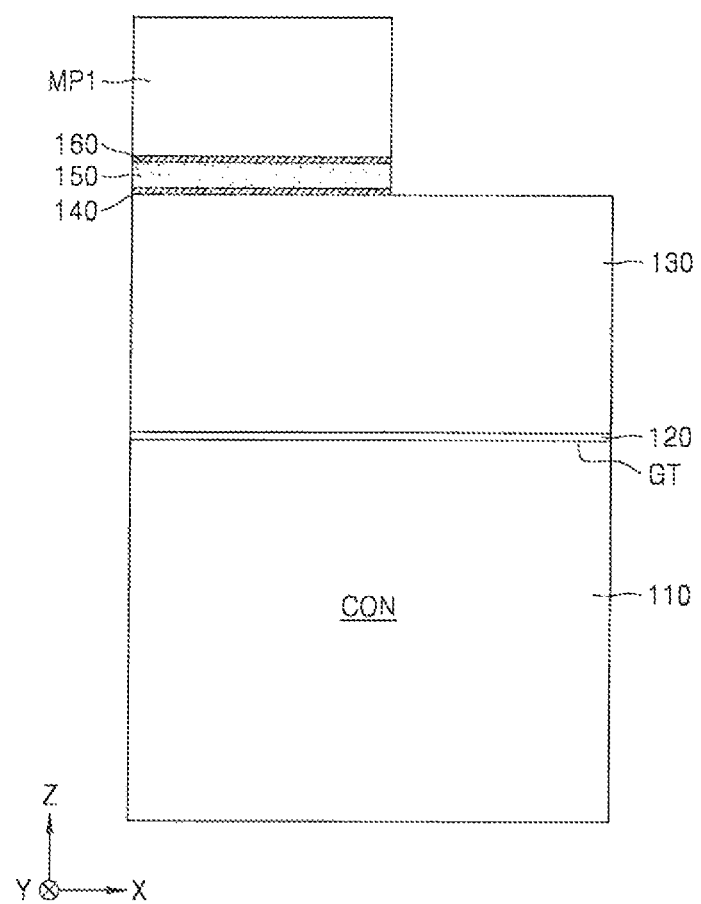

Referring to FIG. 15B, a mask pattern MP1 may be formed on the resultant product in which the gate structure GS may be formed. The mask pattern MP1 may be formed to partially expose the second blocking layer 160 in the connection region CON of the substrate 110. In some embodiments, the mask pattern MP1 may be a photoresist pattern.

A stacked structure of the first blocking layer 140, the upper gate line 150, and the second blocking layer 160 in the connection region CON of the substrate 110 may be selectively partially removed to expose an upper surface of the lower gate line 130 in the gate trench GT.

Figure 15C:
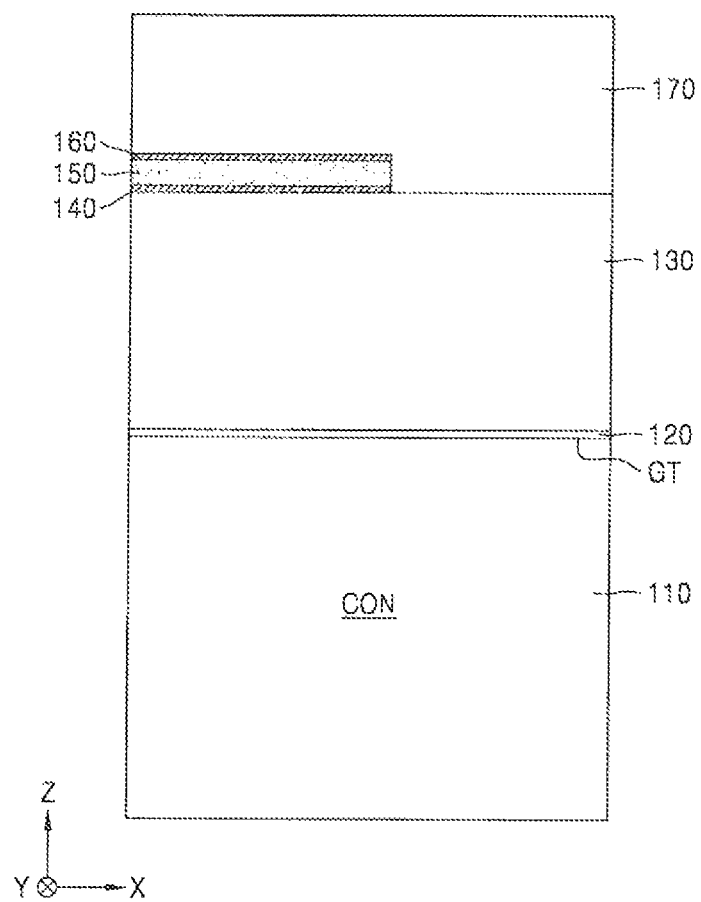

Referring to FIG. 15C, after the mask pattern MP1 is removed from the resultant product of FIG. 15B, the insulating capping pattern 170 may be formed to cover the upper surface of the lower gate line 130 exposed in the gate trench GT and the second blocking layer 160.

Figure 15D:
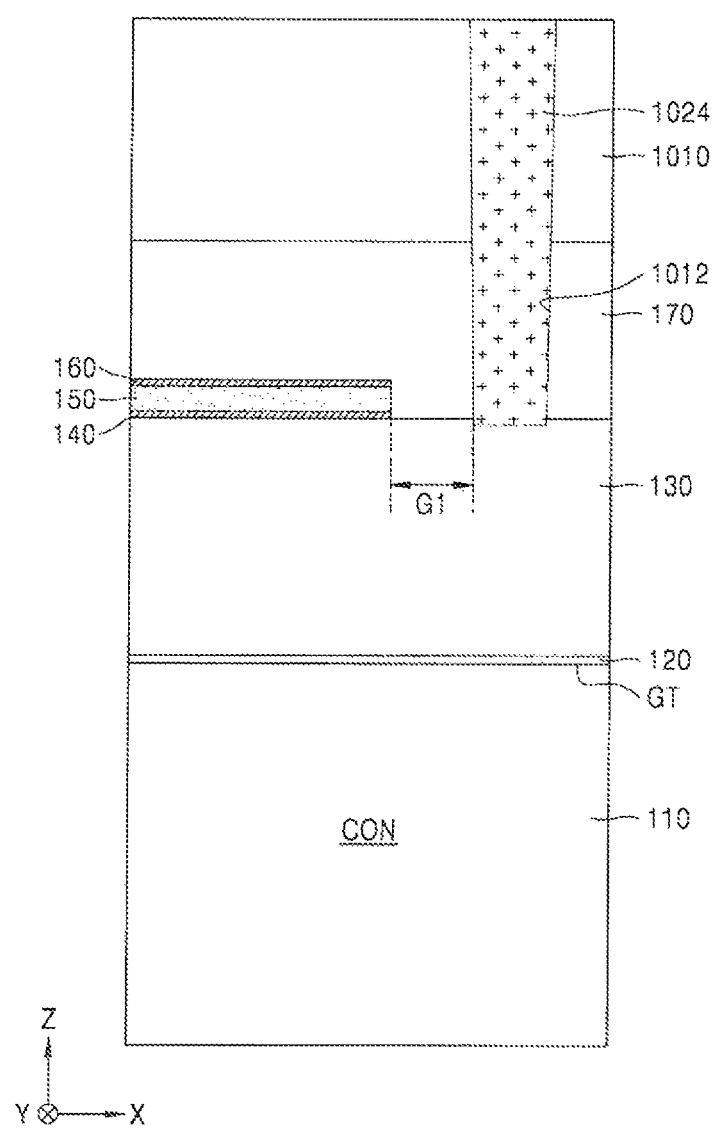

Referring to FIG. 15D, after the operations described with reference to FIGS. 14B to 14H are performed, an interlayer insulating layer 1010 covering the obtained resultant product may be formed. Various structures may be interposed between components of the insulating capping pattern 170 and the interlayer insulating layer 1010 according to a structure of an integrated circuit device to be formed. However, in FIG. 15D, structures interposed between components of the insulating capping pattern 170 and the interlayer insulating layer 1010 may be omitted for simplicity.

The interlayer insulating layer 1010 may be a silicon oxide layer. For example, the interlayer insulating layer 1010 may be a tetraethyl orthosilicate (TEOS) layer, or an ultra-low K (ULK) layer having an ultra-low dielectric constant K of about 2.2 to 2.4. For example, the ULK layer may include a silicon oxycarbide (SiOC) layer or hydrogenated SiOC (SiCOH) layer.

The resultant product having the interlayer insulating layer 1010 may be subjected to a photolithography process to form a contact hole 1012 exposing the lower gate line 130 through the interlayer insulating layer 1010 and the insulating capping pattern 170, and to form a contact plug 1024 filling the contact hole 1012.

In some embodiments, the contact plug 1024 may include a metal layer including Co, Cu, W, or the like, and a conductive barrier layer surrounding the metal layer. The conductive barrier layer may have a Ti/TiN stacked structure. In some embodiments, the contact plug 1024 may include a metal silicide layer containing Ti silicide, Ta silicide, W silicide, or the like.

According to the methods of manufacturing integrated circuit devices described with reference to FIGS. 15A to 15D, the stacked structure of the first blocking layer 140, the upper gate line 150, and the second blocking layer 160 may be selectively partially removed, and thus an operation of etching the first blocking layer 140 including TiN may be omitted when the contact hole 1012 may be formed. Therefore, an etching process for forming the contact hole 1012 may be facilitated. In particular, in a case where other contact holes for forming a wiring connection structure are simultaneously etched in other regions on the substrate 110 when the contact hole 1012 is formed, the contact hole 1012 may be formed simultaneously with insulating layer etching processes for forming the other contact holes without adding a separate process for forming the contact hole 1012, or may be formed by etching the interlayer insulating layer 1010 and the insulating capping pattern 170 under the same etching condition as those of the insulating layer etching processes. Therefore, an additional process may be prevented from being added in a subsequent wire forming operation when forming an integrated circuit device using the first blocking layer 140 including TiN.

Also, the contact hole 1012 may be formed to expose the lower gate line 130 at a position spaced apart from the first blocking layer 140 in a horizontal direction, for example, the X direction. Thereby, after the contact plug 1024 is formed, a structure in which a portion of the insulating capping pattern 170 may be interposed between the contact plug 1024 and the first blocking layer 140 including TiN may be obtained. Therefore, a sufficient insulation distance G1 may be ensured by the insulating capping pattern 170 interposed between the first blocking layer 140 and the contact plug 1024 so that an unwanted reaction or physical damage between the first blocking layer 140 and the contact plug 1024 may be prevented. Also, it may be possible to prevent problems such an increase in contact resistance between the lower gate line 130 and the contact plug 1024 or deterioration of electrical characteristics of an integrated circuit device due to a change in electrical characteristics of a word line including the first blocking layer 140.

FIGS. 16A to 16D are cross-sectional views illustrating operations of methods of manufacturing integrated circuit devices, according to some embodiments of the inventive concepts, in a process sequence. In FIGS. 16A to 16D, the same reference numerals as in FIGS. 15A to 15D denote the same elements, and descriptions thereof may be omitted for brevity.

Figure 16A:
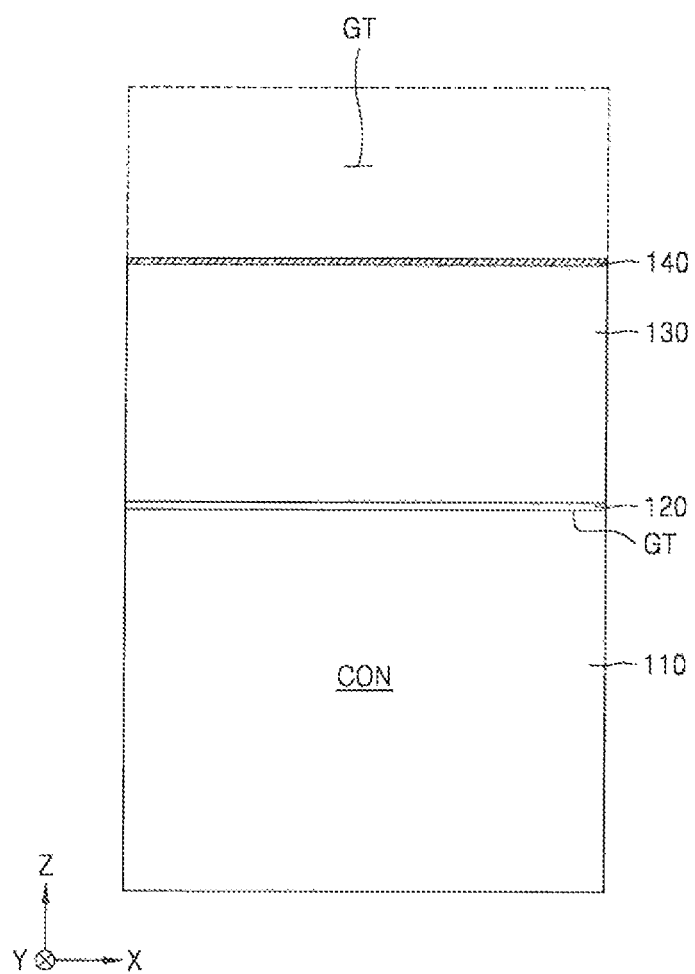
FIGS. 16A to 16D are cross-sectional views illustrating operations of methods of manufacturing integrated circuit devices, according to some embodiments of the inventive concepts, in a process sequence.

Referring to FIG. 16A, the plurality of isolation layers 112 may be formed on the substrate 110, the plurality of gate trenches GT may be formed, and then the resultant product having the plurality of gate trenches GT may be cleaned. Thereafter, the gate dielectric layer 120 may be formed in the plurality of gate trenches GT, and the lower gate line 130 and the first blocking layer 140 may be formed. The first blocking layer 140 may include a TiN layer.

Figure 16B:
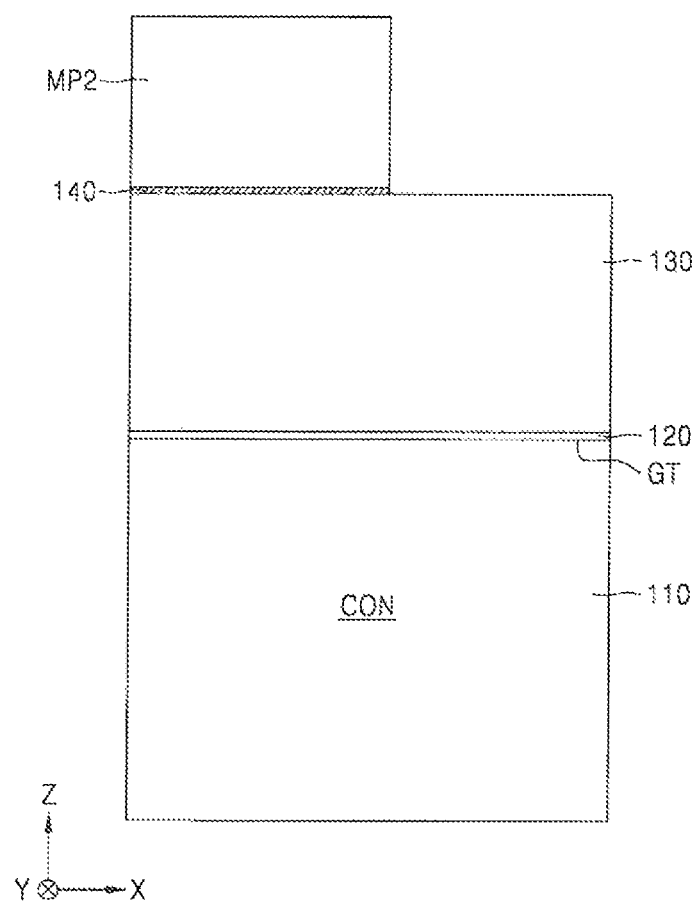

Referring to FIG. 16B, a mask pattern MP2 may be formed on the resultant product, in which the first blocking layer 140 is formed, in the same manner as described with reference to FIG. 15B. The mask pattern MP2 may be formed to partially expose the first blocking layer 140 in the connection region CON of the substrate 110. In some embodiments, the mask pattern MP2 may be a photoresist pattern. The first blocking layer 140 may be selectively partially removed using the mask pattern MP2 as an etching mask. As a result, the upper surface of the lower gate line 130 may be exposed in the gate trench GT.

Figure 16C:
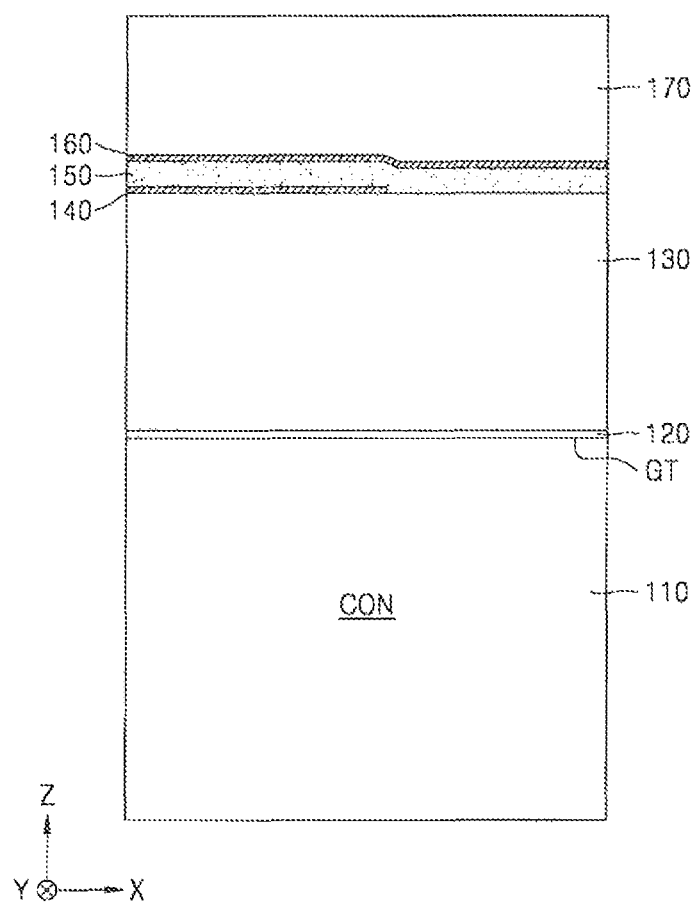

Referring to FIG. 16C, after the mask pattern MP2 is removed from the resultant product of FIG. 16B, the upper gate line 150, the second blocking layer 160, and the insulating capping pattern 170 sequentially covering the upper surface of the lower gate line 130 exposed in the gate trench GT and the first blocking layer 140 may be formed.

Figure 16D:
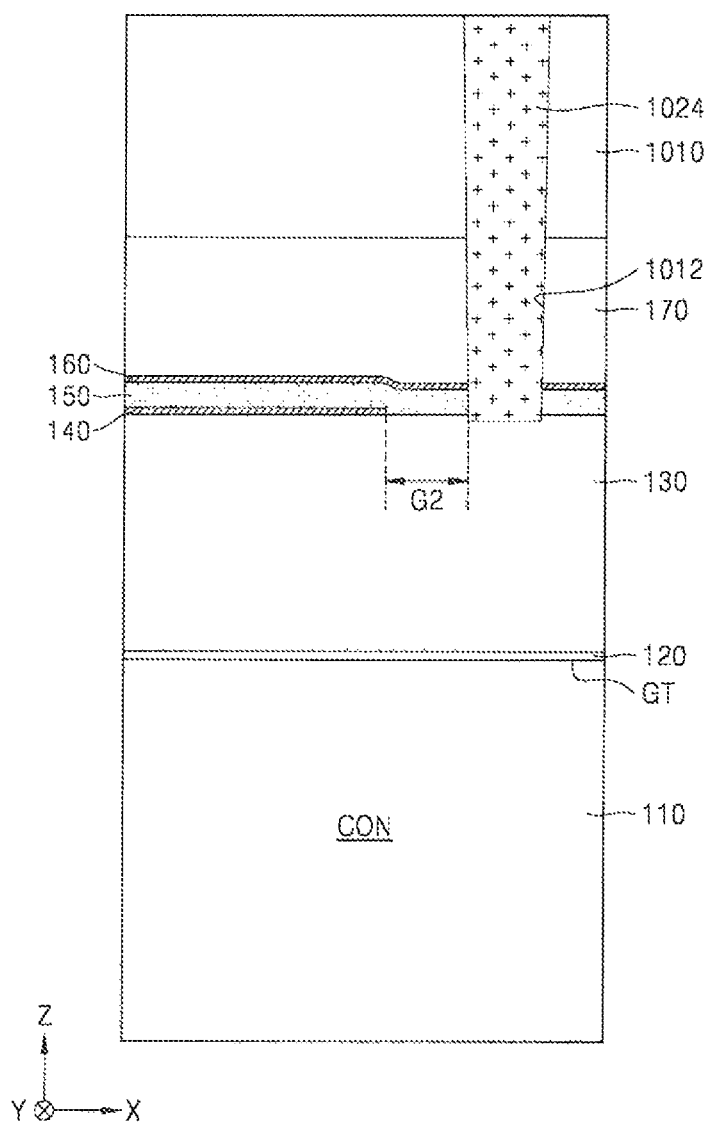

Referring to FIG. 16D, the interlayer insulating layer 1010 may be formed by operations similar to those described with reference to FIG. 15D, and then the contact hole 1012 exposing the lower gate line 130 through the interlayer insulating layer 1010, the insulating capping pattern 170, the second blocking layer 160, and the upper gate line 150 may be formed. Thereafter, the contact plug 1024 filling the contact hole 1012 may be formed.

According to the methods of manufacturing integrated circuit devices described with reference to FIGS. 16A to 16D, since the first blocking layer 140 is selectively partially removed before the contact hole 1012 penetrating through the interlayer insulating layer 1010, the insulating capping pattern 170, the second blocking layer 160, and the upper gate line 150 is formed, there may be no need to add a separate process for etching the first blocking layer 140 including TiN during the formation of the contact hole 1012 and an etching process for forming the contact hole 1012 may be facilitated. Therefore, in a case of forming the integrated circuit device using the first blocking layer 140 including TiN, when other contact holes for forming a wiring connection structure may be simultaneously etched in other regions on the substrate 110 when the contact hole 1012 may be formed, the contact hole 1012 may be formed simultaneously with insulating layer etching processes for forming the other contact holes without adding a separate process for forming the contact hole 1012, or may be formed by etching the interlayer insulating layer 1010 and the insulating capping pattern 170 under the same etching condition as those of the insulating layer etching processes. Furthermore, the contact hole 1012 may be formed so as to expose the lower gate line 130 at a position spaced apart from the first blocking layer 140 in a horizontal direction, for example, the X direction, so that a sufficient insulation distance G2 between the first blocking layer 140 and the contact plug 1024 may be ensured. Therefore, it may be possible to prevent problems such as an increase in contact resistance or deterioration of electrical characteristics of an integrated circuit device.

An integrated circuit device according to some embodiments of the inventive concepts may have a first blocking layer interposed between a lower gate line and an upper gate line having different work functions and a second blocking layer interposed between the upper gate line and an insulating capping pattern. Therefore, problems that components of the lower gate line and the upper gate line are mutually diffused or reacted to form undesired substances, to change work functions, or to generate physical deterioration may be prevented, which may contribute to maintaining original properties and electrical characteristics of each of the lower gate line and the upper gate line. The lower gate line and the upper gate line may be prevented from being physically or chemically damaged. Further, by including a charge trapping region in which fixed charges may be trapped in a gate dielectric layer, a gate induced drain leakage (GIDL) current of a buried channel array transistor (BCAT) including a gate structure may be suppressed and a leakage current in a gate-off state may be suppressed.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the inventive concepts have been particularly shown and described with reference to some embodiments thereof, it will be understood that various changes in form and details may be made therein without departing from the spirit and scope of the following claims.

What is claimed is:

1. An integrated circuit device comprising:
  a substrate comprising a gate trench;
  a gate dielectric layer on an inner surface of the gate trench, wherein the gate dielectric layer comprises a first charge trapping region configured to trap fixed charges at a first density and a second charge trapping region configured to trap fixed charges at a second density higher than the first density, and wherein the second charge trapping region is closer to an upper surface of the substrate than the first charge trapping region;

a gate structure filling a portion of the gate trench on the gate dielectric layer; and an insulating capping pattern on an upper surface of the gate structure in the gate trench, wherein the gate structure comprises:
 a lower gate line having a first work function;
 an upper gate line having a second work function lower than the first work function;
 a first blocking layer between the lower gate line and the upper gate line; and
 a second blocking layer between the upper gate line and the insulating capping pattern, and wherein the second blocking layer comprises a thickness of about 1 Angstrom to about 20 Angstroms.

2. The integrated circuit device of claim 1,
wherein the lower gate line comprises metal, metal nitride, metal carbide, or a combination thereof, and
wherein the upper gate line comprises doped polysilicon.

3. The integrated circuit device of claim 1, further comprising a contact plug extending through the insulating capping pattern to contact the lower gate line,
wherein the first blocking layer is spaced apart, in a longitudinal direction that is parallel to the upper surface of the substrate, from the contact plug with the insulating capping pattern therebetween.

4. The integrated circuit device of claim 3, wherein the second blocking layer and the upper gate line are spaced apart, in the longitudinal direction, from the contact plug with the insulating capping pattern therebetween.

5. The integrated circuit device of claim 1, wherein the first blocking layer has a lower surface in contact with the lower gate line and an upper surface in contact with the upper gate line and has an increasingly higher nitrogen content from the lower surface to the upper surface.

6. The integrated circuit device of claim 1,
wherein the first blocking layer comprises an inner metal-containing layer spaced apart from the gate dielectric layer and an outer metal-containing layer between the gate dielectric layer and the inner metal-containing layer, and
wherein the inner metal-containing layer and the outer metal-containing layer comprise different compositions.

7. The integrated circuit device of claim 6,
wherein the lower gate line comprises a metal-containing liner comprising a first metal and a metal layer comprising a second metal different from the first metal,
wherein the metal layer is spaced apart from the gate dielectric layer with the metal-containing liner therebetween,
wherein the metal-containing liner of the lower gate line contacts the outer metal-containing layer of the first blocking layer, and
wherein the metal layer of the lower gate line contacts the inner metal-containing layer of the first blocking layer.

8. The integrated circuit device of claim 1,
wherein the insulating capping pattern comprises a first silicon nitride layer having a first nitrogen content, and wherein the second blocking layer comprises a second silicon nitride layer having a second nitrogen content greater than the first nitrogen content.

9. The integrated circuit device of claim 1, wherein each of the first blocking layer and the second blocking layer is substantially free of metal.

10. The integrated circuit device of claim 1,
wherein the second blocking layer and the insulating capping pattern comprise different respective materials or nitrogen content,
wherein the first blocking layer comprises a thickness of about 1 Angstrom to about 20 Angstroms, and
wherein the thicknesses of the first and second blocking layers, respectively, are thinner than a thickness of the insulating capping pattern.

11. An integrated circuit device comprising:
a substrate comprising an active region defined by an isolation layer, the substrate further comprising a line-shaped gate trench on the active region;
a gate dielectric layer on the active region and on the isolation layer in the gate trench,
wherein the gate dielectric layer comprises a first charge trapping region located at a first depth from an upper surface of the substrate and configured to trap fixed charges at a first density and a second charge trapping region between the upper surface of the substrate and the first charge trapping region and configured to trap fixed charges at a second density higher than the first density;
a gate structure filling a portion of the gate trench on the gate dielectric layer;
an insulating capping pattern on an upper surface of the gate structure in the gate trench; and
a pair of source/drain regions on opposing sides of the gate structure in the active region,
wherein the gate structure comprises:
 a lower gate line having a first work function;
 an upper gate line having a second work function lower than the first work function;
 a first blocking layer between the lower gate line and the upper gate line; and
 a second blocking layer between the upper gate line and the insulating capping pattern,
wherein the lower gate line has a sidewall adjacent to the first charge trapping region, and each of the upper gate line and the insulating capping pattern have a respective sidewall adjacent to the second charge trapping region, and
wherein the second blocking layer and the insulating capping pattern comprise different respective materials.

12. The integrated circuit device of claim 11, wherein each of the first blocking layer and the second blocking layer comprises sidewalls facing portions of the pair of source/drain regions with the gate dielectric layer therebetween.

13. The integrated circuit device of claim 11, wherein the lower gate line comprises:
a metal-containing liner in contact with the gate dielectric layer; and
a metal layer separated from the gate dielectric layer by the metal-containing liner and separated from the upper gate line by the first blocking layer.

14. The integrated circuit device of claim 13,
wherein the first blocking layer comprises an inner metal-containing layer spaced apart from the gate dielectric layer and in contact with an upper surface of the metal layer and an outer metal-containing layer interposed between the gate dielectric layer and the inner metal-containing layer and in contact with an upper surface of the metal-containing liner, and wherein the inner metal-containing layer and the outer metal-containing layer comprise different compositions from each other.

15. An integrated circuit device comprising:

a substrate comprising a plurality of active regions spaced apart from each other and a line-shaped gate trench extending across the plurality of active regions;

a gate dielectric layer extending across the plurality of active regions in the gate trench;

a gate structure filling a portion of the gate trench on the gate dielectric layer and having gate sidewall portions facing the plurality of active regions; and an insulating capping pattern on an upper surface of the gate structure in the gate trench and having insulating sidewall portions facing the plurality of active regions, wherein the gate structure comprises:

a lower gate line having a first work function;

an upper gate line having a second work function lower than the first work function;

a first blocking layer between the lower gate line and the upper gate line; and a second blocking layer between the upper gate line and the insulating capping pattern, and wherein the gate dielectric layer comprises a first charge trapping region facing the lower gate line and configured to trap fixed charges at a first density and a second charge trapping region facing the insulating capping pattern and configured to trap fixed charges at a second density higher than the first density.

16. The integrated circuit device of claim 15, wherein the lower gate line comprises a plurality of metal-containing layers including metal, metal nitride, metal carbide, or a combination thereof, and wherein the upper gate line comprises doped polysilicon.

17. The integrated circuit device of claim 15, wherein the first blocking layer comprises an inner metal-containing layer spaced apart from the gate dielectric layer and an outer metal-containing layer between the inner metal-containing layer and the gate dielectric layer, and wherein the inner metal-containing layer and the outer metal-containing layer comprise different compositions from each other.

18. The integrated circuit device of claim 15, wherein the first blocking layer comprises a plurality of metal layers, and wherein the second blocking layer is substantially free of metal.

* * * * *